(12) United States Patent
Kim et al.

(10) Patent No.: US 11,139,348 B2
(45) Date of Patent: Oct. 5, 2021

(54) DISPLAY DEVICE

(71) Applicant: Samsung Display Co., Ltd., Yongin-Si (KR)

(72) Inventors: Soo Dong Kim, Hwaseong-si (KR); Min Ki Nam, Incheon (KR); Sung Woon Kim, Yongin-si (KR); Kyoung Won Park, Seoul (KR); Su Jin Kim, Seoul (KR)

(73) Assignee: Samsung Display Co., Ltd.

( * ) Notice: Subject to any disclaimer, the term of this patent is extended or adjusted under 35 U.S.C. 154(b) by 163 days.

(21) Appl. No.: 16/674,050

(22) Filed: Nov. 5, 2019

(65) Prior Publication Data

US 2020/0168668 A1 May 28, 2020

(30) Foreign Application Priority Data

Nov. 27, 2018 (KR) .................. 10-2018-0148149
Jul. 31, 2019 (KR) .................. 10-2019-0093270

(51) Int. Cl.
*H01L 27/32* (2006.01)
*H01L 51/52* (2006.01)

(52) U.S. Cl.
CPC ........ *H01L 27/322* (2013.01); *H01L 27/3213* (2013.01); *H01L 51/5271* (2013.01); *H01L 27/3218* (2013.01); *H01L 27/3244* (2013.01)

(58) Field of Classification Search
None
See application file for complete search history.

(56) References Cited

U.S. PATENT DOCUMENTS

2005/0270444 A1 12/2005 Miller et al.
2008/0124997 A1* 5/2008 Park .................. G02F 1/133514
445/25

(Continued)

FOREIGN PATENT DOCUMENTS

KR 10-2016-0000811 A 1/2016
KR 10-2017-0064164 A 6/2017

(Continued)

OTHER PUBLICATIONS

Extended European Search Report, Application No. 19207447.4 dated Mar. 27, 2020, 7 pages.

*Primary Examiner* — Andres Munoz
(74) *Attorney, Agent, or Firm* — Innovation Counsel LLP

(57) ABSTRACT

A display device is provided. The display device includes a substrate; a light-emitting layer providing first light having a first wavelength; and a light converter disposed on the light-emitting layer, wherein the plurality of pixels include first, second, third, and fourth pixels which includes first and second subpixels, the light converter includes a first wavelength conversion layer and a second wavelength conversion layer disposed in the first pixel and the second pixel, respectively, a light-transmitting layer disposed in the third pixel, and a third wavelength conversion layer disposed in the first subpixel, the first wavelength conversion layer and the second wave length conversion layer include a first wavelength conversion material and a second wavelength conversion material which convert the first light into light having different wavelength, respectively, the third wavelength conversion layer includes the first and second wavelength conversion materials.

28 Claims, 27 Drawing Sheets

(56) References Cited

U.S. PATENT DOCUMENTS

| | | | |
|---|---|---|---|
| 2009/0051283 A1* | 2/2009 | Cok | H01L 27/3213 313/506 |
| 2009/0085478 A1* | 4/2009 | Cok | H01L 51/5036 313/506 |
| 2014/0145586 A1* | 5/2014 | Choi | G09G 3/3208 313/504 |
| 2017/0207281 A1 | 7/2017 | Hack et al. | |
| 2019/0179065 A1 | 6/2019 | Kim et al. | |
| 2019/0296088 A1 | 9/2019 | Kim et al. | |

FOREIGN PATENT DOCUMENTS

| | | |
|---|---|---|
| KR | 10-2019-0067955 A | 6/2019 |
| KR | 10-2019-0110660 A | 10/2019 |

* cited by examiner

DISPLAY DEVICE

This application claims priority to Korean Patent Application No. 10-2018-0148149, filed on Nov. 27, 2018, and Korean Patent Application No. 10-2019-0093270, filed on Jul. 31, 2019, and all the benefits accruing therefrom under 35 U.S.C. §119, the disclosure of which is incorporated herein by reference in its entirety.

BACKGROUND

1. Field

The present disclosure relates to a display device, and more particularly, to a display device including white pixels.

2. Description of the Related Art

Display devices have increasingly become important with the development of multimedia. Accordingly, various display devices such as a liquid crystal display device (LCD), an organic light-emitting diode (OLED) display device, and the like have been developed.

The OLED display device does not need a separate light source and can thus have a reduced thickness and light weight. Also, the OLED display device is currently garnering attention as a next-generation display device by virtue of its characteristics such as low power consumption, high luminance and contrast, and high response speed. However, the electrodes and metal wires of the OLED display device reflect light incident from the outside of the OLED display device. Thus, when the OLED display device is used in a bright place, it is difficult to realize full black gradation due to the reflection of external light, and the contrast of the OLED display device may be lowered.

Recently, it has been studied to use a wavelength conversion layer to improve the display quality (such as color reproducibility) of a display device. However, wavelength conversion materials and scatterers included in the wavelength conversion layer may aggravate the reflection of external light.

SUMMARY

Embodiments of the present disclosure provide a display device which can improve full-white luminance by adding white pixels.

Embodiments of the present disclosure provide a display device which can realize neutral black reflection having no polarizing layer.

Embodiments of the present disclosure provide a display device which can correct reflected color coordinates changed by yellow reflection of white pixels.

However, embodiments of the present disclosure are not restricted to those set forth herein. The above and other embodiments of the present disclosure will become more apparent to one of ordinary skill in the art to which the present disclosure pertains by referencing the detailed description of the present disclosure given below.

An embodiment of a display device includes a substrate including a plurality of pixel regions on which a plurality of pixels are disposed; a light-emitting layer disposed on the substrate and providing first light having a first wavelength; and a light converter disposed on the light-emitting layer and receiving the first light, wherein the plurality of pixels include first, second, third, and fourth pixels, the fourth pixel includes first and second subpixels, the light converter includes a first wavelength conversion layer which is disposed in the first pixel, a second wavelength conversion layer which is disposed in the second pixel, a light-transmitting layer which is disposed in the third pixel, a third wavelength conversion layer which is disposed in the first subpixel, and a color filter layer which is disposed in the third pixel and the second subpixel, and includes a color filter transmitting the first light therethrough, the first wavelength conversion layer includes a first wavelength conversion material which converts the first light into second light having a second wavelength that is longer than the first wavelength, the second wavelength conversion layer includes a second wavelength conversion material which converts the first light into third light having a third wavelength that is longer than the first wavelength, the third wavelength conversion layer includes the first and second wavelength conversion materials.

An embodiment of a display device includes a first pixel; a second pixel; a third pixel; and a fourth pixel, wherein the first, second, third, and fourth pixels are sequentially arranged adjacent to one another in a first direction, the fourth pixel includes first and second subpixels arranged in a second direction, which is perpendicular to the first direction, one of the first and second pixels is a red pixel including a red color filter and the other pixel is a green pixel including a green color filter, the third pixel is a blue pixel including a blue color filter, each of the first pixel, the second pixel, the third pixel, and the first subpixel includes a light-emitting layer emitting blue light, one of the first and second pixels includes a first wavelength conversion layer which includes a first wavelength conversion material that converts the blue light into red light and the other pixel includes a second wavelength conversion layer which includes a second wavelength conversion material that converts the blue light into green light, the first subpixel includes a third wavelength conversion layer which includes the first and second wavelength conversion materials, and the second subpixel includes the blue color filter.

An embodiment of a display device includes a substrate including a plurality of pixel regions on which a plurality of pixels are disposed; a light-emitting layer disposed on the substrate and providing first light having a first wavelength; and a light converter disposed on the light-emitting layer and receiving the first light, wherein the plurality of pixels include first, second, third, and fourth pixels, the light converter includes a first wavelength conversion layer which is disposed in the first pixel, a second wavelength conversion layer which is disposed in the second pixel, a light-transmitting layer which is disposed in the third pixel, and a third wavelength conversion layer which is disposed in the fourth pixel, the first wavelength conversion layer includes a first wavelength conversion material which converts the first light into second light having a second wavelength that is longer than the first wavelength, the second wavelength conversion layer includes a second wavelength conversion material which converts the first light into third light having a third wavelength that is longer than the first wavelength, the third wavelength conversion layer includes the first and second wavelength conversion materials, the display device further comprises a matrix pattern disposed on the substrate along boundaries of each of the plurality of pixels, and the matrix pattern reflects the first light.

According to the aforementioned and other embodiments of the present disclosure, full-white luminance can be improved by adding white pixels. Also, since all red, green, and blue pixels do not need to be driven to realize white light, the power consumption of a display device can be reduced.

In a polarizer-less display device having no polarizing layer, neutral black reflection can be realized by correcting reflected color coordinates changed by yellow reflection of white pixels.

Other features and embodiments may be apparent from the following detailed description, the drawings, and the claims.

BRIEF DESCRIPTION OF THE DRAWINGS

The above and other embodiments and features of the present disclosure will become more apparent by describing in detail embodiments thereof with reference to the attached drawings, in which.

DETAILED DESCRIPTION

Figure 1:
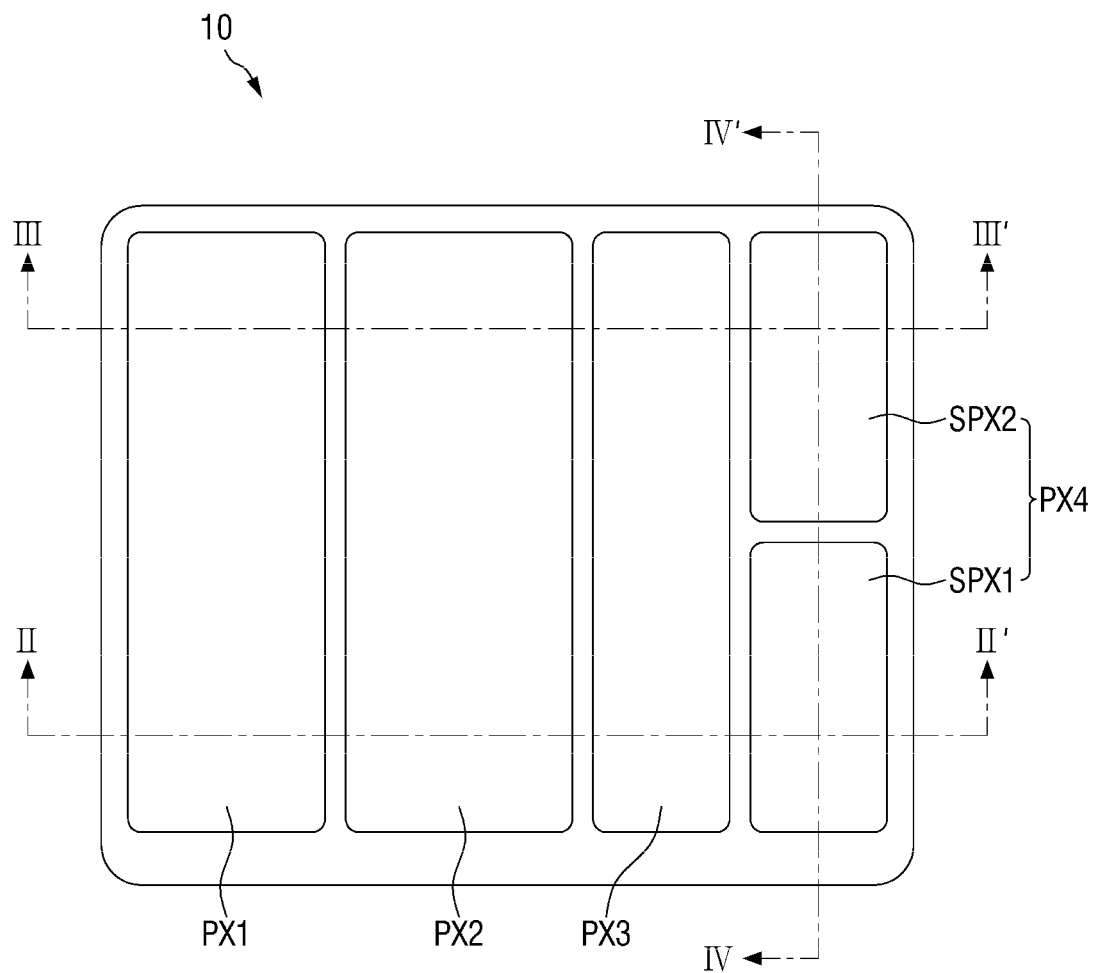
FIG. 1 is a plan view of a display device according to an embodiment of the present disclosure.

Features of the inventive concept and methods of accomplishing the same may be understood more readily by reference to the following detailed description of embodiments and the accompanying drawings. The inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the inventive concept will only be defined by the appended claims. Like reference numerals refer to like elements throughout the specification.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

In the present specification, a first direction X means any one direction in a plane, a second direction Y means a direction intersecting the first direction X in the plane, a third direction Z means a direction perpendicular to the plane.

Hereinafter, exemplary embodiments of the present disclosure will be described with reference to the accompanying drawings.

FIG. 1 is a plan view of a display device according to an embodiment of the present disclosure. Referring to FIG. 1, a plurality of pixels (PX1, PX2, PX3, and PX4) may be defined in a display device 10. The term "pixel", as used herein, refers to a single region that displays single primary color and is recognizable by a user due to transmitted light or reflected light. That is, pixels are the smallest units of the display device 10 for displaying colors independently.

The plurality of pixels (PX1, PX2, PX3, and PX4) may include a first pixel PX1 displaying a first color, a second pixel PX2 displaying a second color which has a shorter wavelength than the first color, and a third pixel PX3 displaying a third color which has a shorter wavelength than the second color. The plurality of pixels (PX1, PX2, PX3, and PX4) may further include a fourth pixel PX4 displaying a fourth color. The fourth color may be a color obtained by mixing the first, second and third colors together.

The first color may be light having a first wavelength band. The second color may be light having a second wavelength band. The third color may be light having a third wavelength band. Here, the first, second, and third wavelength bands may differ from one another. The peak wavelength of the first wavelength band may be in the range of about 600 nm to about 670 nm The peak wavelength of the second wavelength band may be in the range of about 500 nm to about 570 nm. The peak wavelength of the third wavelength band may be in the range of about 420 nm to about 480 nm.

The first pixel PX1 may be a red pixel displaying red, the second pixel PX2 may be a green pixel displaying green, and the third pixel PX3 may be a blue pixel displaying blue. The fourth pixel PX4 may include a plurality of subpixels. At least one of the subpixels of the fourth pixel PX4 may display mixed light into which the first color light, the second color light, and the third color light are mixed. The subpixel of the fourth pixel PX4 that displays the mixed color may display white, but the present disclosure is not limited thereto. Alternatively, the subpixel of the fourth pixel PX4 that displays the mixed color may display various colors obtained by mixing two or more colors.

The first, second, third, and fourth pixels PX1, PX2, PX3, and PX4 may be sequentially arranged side-by-side along a first direction. In one embodiment, the second pixel PX2 may have a largest size, the first pixel PX1 may have a second largest size, and the fourth pixel PX4 may be smaller in size than the first and second pixels PX1 and PX2 and may have substantially the same size as the third pixel PX3. The first, second, third, and fourth pixels PX1, PX2, PX3, and PX4 may form a dot and the dot may be arranged in a matrix form in a plan view.

The fourth pixel PX4 may include a first subpixel SPX1 and a second subpixel SPX2 arranged adjacent to the first subpixel SPX1 in a second direction. The first and second subpixels SPX1 and SPX2 may have the same width in the first direction. The first and second subpixels SPX1 and SPX2 are illustrated as having the same width not only in the first direction, but also in the second direction, but the sizes of the first and second subpixels SPX1 and SPX2 may be altered as necessary.

The fourth pixel PX4 may include a subpixel displaying white. In one embodiment, the first subpixel SPX1 may display white. The second subpixel SPX2 does not include a light-emitting layer but includes a color filter which serves as a reflected light controlling pixel for controlling the color coordinates of reflected light. The color filter of the second subpixel SPX2 may include the same color filter as the third pixel PX3, i.e., a blue color filter. The structure of the fourth pixel PX4 will be described later in detail.

Figure 2:
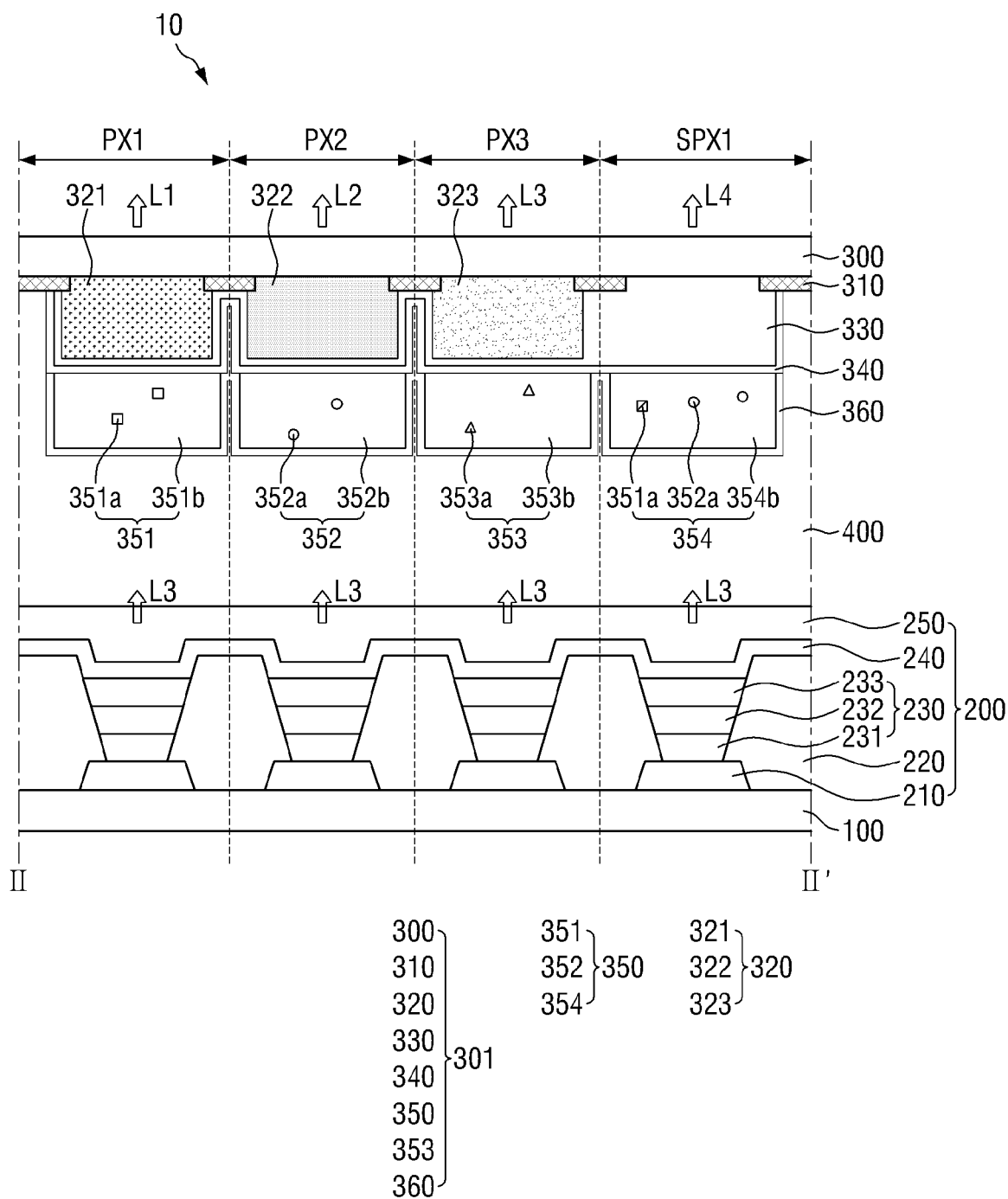
FIG. 2 is a cross-sectional view taken along line II-II' of FIG. 1.
Figure 3:
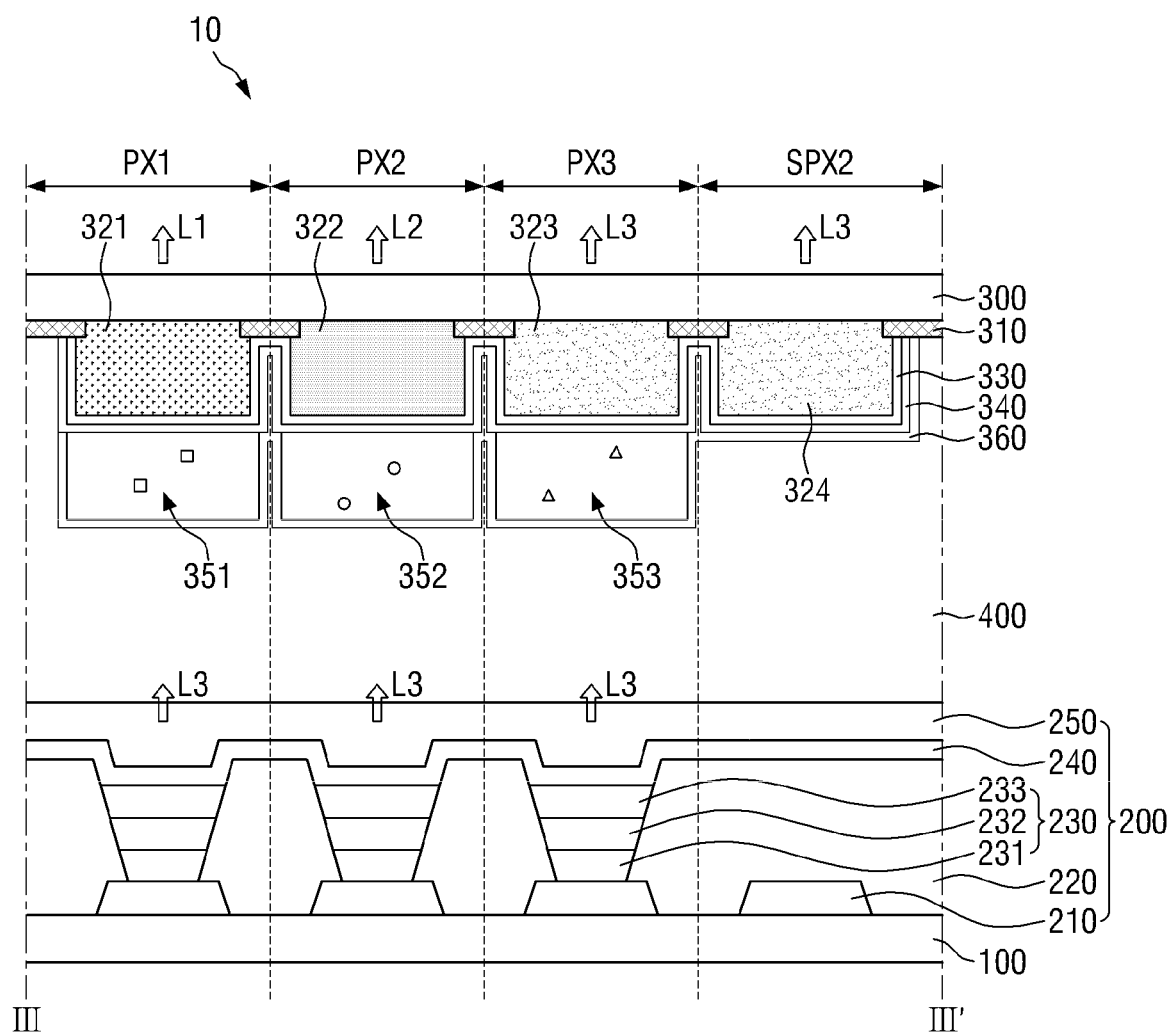
FIG. 3 is a cross-sectional view taken along line III-III' of FIG. 1.
Figure 4:
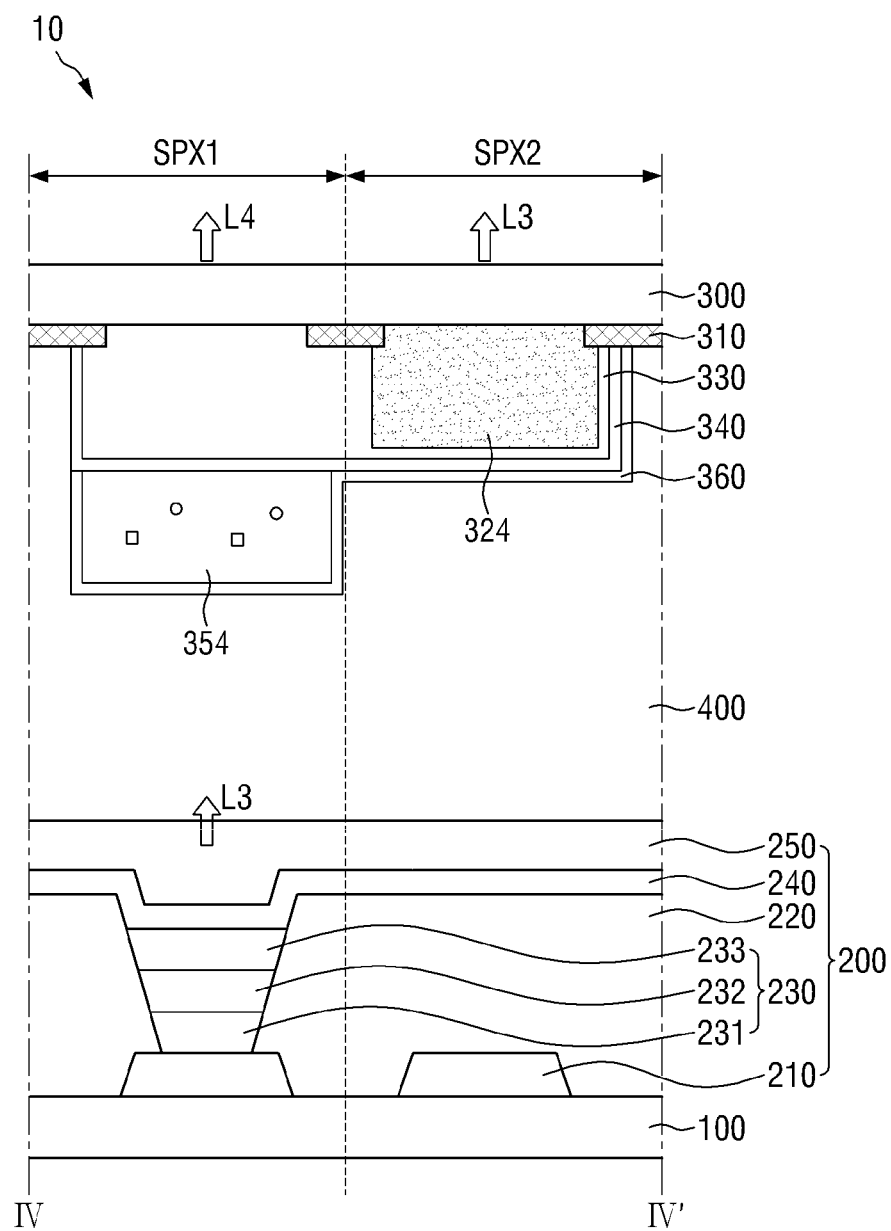
FIG. 4 is a cross-sectional view taken along line IV-IV' of FIG. 1.

FIG. 2 is a cross-sectional view taken along line II-IF of FIG. 1. FIG. 3 is a cross-sectional view taken along line III-III' of FIG. 1. FIG. 4 is a cross-sectional view taken along line IV-IV' of FIG. 1.

The cross-sectional structure of the display device 10 will hereinafter be described with reference to FIGS. 1 through 4. The display device 10 includes a light provider 200 and a light converter 301 receiving light from the light provider 200 and changing the wavelength or transmitting the received light. The light provider 200 may include a light-emitting layer or a light transmitter transmitting incident light. In the description that follows, it is assumed that the light provider 200 includes a light-emitting layer including self-luminous elements.

The light provider 200 includes a first substrate 100 and first electrodes 210, a pixel defining film 220, a light-emitting layer 230, a second electrode 240, and an encapsulation layer 250, which are sequentially disposed on the first substrate 100. The light-emitting layer 230 may be disposed between the first electrodes 210 and the second electrode 240. The first electrodes 210 and the second electrode 240 may be electrically connected to both ends of the light-emitting layer 230.

The first substrate 100 may be a transparent or opaque insulating substrate or film. For example, the first substrate 100 may be formed of a glass material or a quartz material or may include a flexible polymer material such as polyimide, polycarbonate, polyethylene terephthalate, and polyacrylate. That is, the first substrate 100 may be a flexible substrate that is bendable, foldable, or rollable.

Although not specifically illustrated, one or more thin-film transistors may be disposed on the first substrate 100. The thin-film transistors may provide a current or voltage for driving light-emitting elements included in particular pixels.

The first electrodes 210 may be disposed on the first substrate 100. The first electrodes 210 may be pixel electrodes. Each of the first electrodes 210 may be disposed in each of the pixels (or subpixels). The first electrodes 210 disposed in different pixels may be spaced apart from one another. The first electrodes 210 may be anode electrodes. That is, the first electrodes 210 may provide holes to the light-emitting layers 230.

The first electrodes 210 may include a high work function material layer selected from a group consisting of indium tin oxide (ITO), indium zinc oxide (IZO), zinc oxide (ZnO), or indium oxide ($In_2O_3$) and a reflective material layer formed of silver (Ag), magnesium (Mg), aluminum (Al), platinum (Pt), gold (Au), nickel (Ni), neodymium (Nd), iridium (Ir), chromium (Cr), lithium (Li), calcium (Ca), and a mixture thereof. Also, the first electrodes 210 may have a multilayer structure selected from a group consisting of ITO/Mg, ITO/MgF, ITO/Ag, and ITO/Ag/ITO, but the present disclosure is not limited thereto.

The pixel defining film 220 may be disposed on the first substrate 100 to cover at least a portion of the first electrodes 210 for example, edges of the first electrodes 210. The pixel defining film 220 may be disposed at the boundaries between the plurality of pixels (PX1, PX2, PX3, and PX4). The pixel defining film 220 may include openings exposing parts of the first electrodes 210. The openings of the pixel defining film 220 may expose the first electrodes 210 disposed in the first pixel PX1, the second pixel PX2, the third pixel PX3, and the first subpixel SPX1 of the fourth pixel. There exists no opening of the pixel defining film 220 above the first electrode 210 disposed in the second subpixel SPX2 of the fourth pixel PX4, and the first electrode 210 disposed in the second subpixel SPX2 of the fourth pixel PX4 is completely covered by the pixel defining film 220.

The pixel defining film 220 may be formed of an inorganic insulating material such as silicon oxide, silicon nitride, silicon oxynitride, hafnium oxide, aluminum oxide, titanium oxide, tantalum oxide, or zinc oxide or an organic insulating material such as an acrylic resin, an epoxy resin, a phenolic resin, a polyamide resin, a polyimide resin, an unsaturated polyester resin, a polyphenylene resin, a polyphenylene sulfide resin, or benzocyclobutene (BCB). The pixel defining film 220 may be a single-layer film or a multilayer film including different materials.

The light-emitting layer 230 may be disposed in the openings of the pixel defining film 220. The light-emitting layer 230 may form light-emitting elements together with the first electrodes 210 and the second electrode 240. The light-emitting layer 230 may be disposed on the first electrodes 210 of the first, second, third pixels PX1, PX2, and PX3 and the first subpixel SPX1 of the fourth pixel PX4 that are exposed by the openings of the pixel defining film 220. The light-emitting layer 230 may not be disposed in the second subpixel SPX2 of the fourth pixel PX4 in which the openings of the pixel defining film 220 are not disposed.

In some embodiments, the light-emitting layer 230 may include a first auxiliary layer 231, an active layer 232, and a second auxiliary layer 233.

Specifically, the first auxiliary layer 231, the active layer 232, and the second auxiliary layer 233 may be sequentially disposed on the first substrate 100 on the first electrodes 210. The first auxiliary layer 231 may include a hole transport layer (HTL) delivering holes injected from the first electrodes 210. The first auxiliary layer 231 may further include a hole injection layer (HIL) disposed between the first substrate 100 and the HTL. The second auxiliary layer is 233 may include an electron transport layer (ETL) delivering electrons injected from the second electrode 240. The second auxiliary layer 233 may further include an electron injection layer (EIL) disposed between the second electrode 240 and the ETL.

The active layer 232 may be disposed between the first and second auxiliary layers 231 and 233. Holes supplied from the first auxiliary layer 231 and electrons supplied from the second auxiliary layer 233 may be combined together to generate excitons and thus to emit light. The light emitted by the active layer 232 may be light L3 of the third color having the third wavelength band. That is, the active layer 232 may emit blue light. The material of the active layer 232 is not particularly limited as long as it can emit light having the third color. Alternatively, the emitted light may be light having a fourth wavelength band, which is a shorter wavelength band than the third wavelength band. The light of the fourth wavelength band may be ultraviolet light or near ultraviolet light. That is, incident light L3, which is incident upon a light-transmitting layer 353 and a wavelength conversion layer 350, may be ultraviolet light or near ultraviolet light.

In some embodiments, the active layer 232 may be an organic light-emitting layer. The active layer 232 may include a host and a dopant. In other embodiments, the active layer 232 may be an inorganic light-emitting layer or a light-emitting layer in which an inorganic material and an organic material are mixed. For example, the active layer 232 may be a light-emitting layer in which inorganic material-based quantum dots, an organic material-based host, and an organic material-based dopant are mixed.

Although not specifically illustrated, the light-emitting layer 230 may include a plurality of active layers 232 which overlap with one another. In a case where multiple active layers 232 are provided, a charge generation layer (CGL) may be further disposed between the multiple active layers 232.

The second electrode 240 may be disposed on the pixel defining film 220 and the second auxiliary layer 233. The second electrode 240 may be a common electrode. The second electrode 240 may be disposed not only in pixels where the light-emitting layer 230 is formed, but also in the second subpixel SPX1 of the fourth pixel PX4 where the light-emitting layer 230 is not formed. The second electrode 240 may be disposed on the entire first substrate 100. The second electrode 240 may be a cathode electrode. The second electrode 240 may include a layer of a low-work function material such as Li, Ca, LiF/Ca, LiF/Al, Al, Mg, Ag, Pt, Pd, Ni, Au Nd, Ir, Cr, BaF, Ba, or a compound or mixture thereof (e.g., the mixture of Ag and Mg). The second electrode 240 may further include a transparent metal oxide layer disposed on the layer of the low work function material.

The encapsulation layer 250 may be disposed on the second electrode 240. The encapsulation layer 250 may be disposed on the light provider 200 to seal the light-emitting layer 230 and thus to prevent the infiltration of external impurities or moisture into the display device 10. The encapsulation layer 250 may be formed as a single-layer film including an inorganic film. Alternatively, the encapsulation layer 250 may be formed of a multilayer film in which one or more inorganic films and one or more organic films are alternately stacked. For example, the encapsulation layer 250 may include two inorganic films and an organic film which is disposed between the two inorganic films. Still alternatively, the encapsulation layer 250 may include an encapsulation substrate.

The light converter 301 may include a second substrate 300 and a color filter layer 320, the wavelength conversion layer 350, and the light-transmitting layer 353, which are disposed on the second substrate 300. The light converter 301 may further include a black matrix 310, a low reflection layer 330, a first capping layer 340, and a second capping layer 360.

The second substrate 300 may be a transparent insulating substrate. The transparent insulating substrate may include glass, quartz, or translucent plastic. In one embodiment, the second substrate 300 may be a flexible substrate that is bendable, foldable, or rollable.

The light converter 301 may further include the black matrix 310. The black matrix 310 may be disposed on the second substrate 300. The black matrix 310 blocks the transmission of light therethrough to prevent color mixing between neighboring pixels. The black matrix 310 may be disposed at the boundaries between the plurality of pixels (PX1, PX2, PX3, and PX4) and even on the boundary between the subpixels SPX1 and SPX2. The material of the black matrix 310 is not particularly limited as long as it can absorb light incident onto the black matrix 310 and can thus block the transmission of light therethrough. In one embodiment, the black matrix 310 may include an organic material or a metal material comprising chromium. In another embodiment, the black matrix 310 may reflect light having a wavelength of about 380 nm to 500 nm The black matrix 310 will be described later in detail with reference to FIG. 22.

The color filter layer 320 may be disposed on the second substrate 300 and the black matrix 310. The color filter layer 320 may include a first color filter 321 which is disposed in the first pixel PX1, a second color filter 322 which is disposed in the second pixel PX2, and a third color filter 323 which is disposed in the third pixel PX3. The color filter layer 320 may further include a fourth color filter 324 which is disposed in the second subpixel SPX2. In one embodiment, the third and fourth color filters 323 and 324 may transmit the same color. In one embodiment, the third pixel PX3 and the second subpixel SPX2 may be formed separately. In another embodiment, the third color filter 323 which is formed in the third pixel PX3 and the fourth color filter 324 which is formed in the second subpixel SPX2 may be formed at the same time. Although not specifically illustrated, in yet another embodiment, the third color filter 323 and the fourth color filter 324 may be formed at the same time to form single color filter, in which case, the black matrix 310 may not be disposed between the third pixel PX3 and the second subpixel SPX2.

No color filter may be disposed in the first subpixel SPX1 of the fourth pixel PX4, which is a white pixel. The first subpixel SPX1 of the fourth pixel PX4 may be filled with a material other than a color filter. For example, the low reflection layer 330 may be formed thickly in the first subpixel SPX1 such that the bottom surface of the first subpixel SPX1 and the bottom surfaces of other pixels can be substantially planarized, but the present disclosure is not limited thereto. Alternatively, the thickness of the low reflection layer 330 may be substantially the same in the first subpixel SPX1 as that in other pixels so that a height difference between the first subpixel SPX1 and other pixels may be formed due to an absence of the color filter layer 320 in the first subpixel SPX1. The height difference may be the same as a thickness of the color filter layer 320. Still alternatively, a filler material other than the low reflection layer 330 may be further disposed in the first subpixel SPX1 to substantially planarize the surfaces of the plurality of pixels (PX1, PX2, PX3, and PX4).

The color filter layer 320 may selectively transmit some of the wavelength band of incident light. For example, the first color filter 321 may selectively transmit incident light in a red wavelength band therethrough and may block incident light in green and blue wavelength bands. In one embodiment, the first color filter 321 may be a red color filter, the second color filter 322 may be a green color filter, and the third color filter 323 may be a blue color filter. In another embodiment, the first and second color filters 321 and 322 may both be formed as yellow color filters. That is, the first and second color filters 321 and 322 may selectively transmit light in the red and green wavelength bands therethrough and may block light in the blue wavelength band. In other words, the first and second color filters 321 and 322 may be blue light cut filters.

The low reflection layer 330 may be disposed on the color filter layer 320. The low reflection layer 330 may be formed by depositing materials having different refractive indexes. In one embodiment, the low reflection layer 330 may have a stack of $TiO_2$ which is a high refractive index material and $SiO_2$ which is a low refractive index material. The low reflection layer 330 is illustrated as being relatively thick in the first subpixel SPX1 of the fourth pixel PX4 where the color filter layer 320 is not disposed so that the bottom surfaces of the plurality of pixels (PX1, PX2, PX3, and PX4) are substantially planarized, but the present disclosure is not limited thereto. In some embodiments, the low reflection layer 330 may not be provided.

The first capping layer 340 may be disposed on the low reflection layer 330. In a case where the display device 10 includes the low reflection layer 330, the first capping layer 340 may be disposed along the surface of the low reflection layer 330 to have a substantially uniform thickness. In some embodiments, in a case where the low reflection layer 330 is not provided, the first capping layer 340 may be disposed on the second substrate 300 to cover the color filter layer 320 and may be disposed along the surface of the color filter layer 320. The first capping layer 340 can prevent the color filter layer 320 and the wavelength conversion layer 350 from being damaged or deformed due to the infiltration of external impurities such as moisture or air. The first capping layer 340 may be formed of an inorganic material such as silicon oxide, silicon oxynitride, and silicon nitride.

The light-transmitting layer 353 and the wavelength conversion layer 350 may be disposed on the first capping layer 340. In one embodiment, the light-transmitting layer 353 and the wavelength conversion layer 350 may have substantially the same thickness or similar thicknesses. The light-transmitting layer 353 and the wavelength conversion layer 350 arranged in different pixels do not overlap with each other.

For example, the wavelength conversion layer 350 may be disposed in the first pixel PX1, the second pixel PX2, and the first subpixel SPX1 of the fourth pixel PX4, and none of the wavelength conversion layer 350 and the light-transmitting layer 353 may be disposed in the second subpixel SPX2 of the fourth pixel PX4. The second subpixel SPX2 of the fourth pixel PX4 where the wavelength conversion layer 350 and the light transmitting layer 353 are not disposed may be filled with a filler layer 400, which will be described later.

In some embodiments, the light-transmitting layer 353 may be disposed in the third pixel PX3. The light-transmitting layer 353 may include a third light-transmitting resin 353b and scatterers 353a dispersed in the third light-transmitting resin 353b. The material of the third light-transmitting resin 353b is not particularly limited as long as it has excellent dispersion characteristics with respect to the scatterers 353a and light transmittance. For example, the third light-transmitting resin 353b may include an acrylic resin, an imide resin, or an epoxy resin.

The scatterers 353a may be particles having a different refractive index from the third light-transmitting resin 353b, for example, light-scattering particles. The material of the scatterers 353a is not particularly limited as long as it can form an optical interface with the third light-transmitting resin 353b and can thus scatter transmitted light. For example, the scatterers 353a may be particles of a metal oxide or particles of an organic material. Examples of the metal oxide include titanium oxide ($TiO_2$), zirconium oxide ($ZrO_2$), aluminum oxide ($Al_2O_3$), indium oxide ($In_2O_3$), zinc oxide (ZnO), and tin oxide ($SnO_2$), and examples of the organic material include an acrylic resin and a urethane resin. The scatterers 353a may scatter light in various directions regardless of the incidence angle of the light without substantially changing the wavelength of light passing through the light-transmitting layer 353. As a result, the side visibility of the display device 10 can be improved.

In some embodiments, the light-transmitting layer 353 may further include a colorant dispersed or dissolved in the third light-transmitting resin 353b. The colorant may be dispersed or dissolved in the third light-transmitting resin 353b and may thus selectively absorb at least some of the wavelength band of incident light. For example, the colorant may be a blue colorant such as a blue dye or a blue pigment. In a case where the light-transmitting layer 353 further includes a blue colorant, and the light-transmitting layer 353 can sharpen the blue spectrum displayed by the third pixel PX3.

In one embodiment, in a case where light incident upon the light-transmitting layer 353 has the third wavelength band, light transmitted through the light-transmitting layer 353 may also have the third wavelength band. In this case, the wavelength band of the light incident upon the light-transmitting layer 353 may not change at all or may change only a little. In another embodiment, in a case where the light incident upon the light-transmitting layer 353 has the fourth wavelength band, the light-transmitting layer 353 may further include wavelength conversion materials which will be described later. When the light-transmitting layer 353 includes the wavelength conversion materials, the light incident upon the light-transmitting layer 353 may be transformed into light having the third wavelength band and the transformed light is emitted.

The wavelength conversion layer 350 may include a material capable of converting or transforming the wavelength band of light incident thereto from the outside. Accordingly, the wavelength conversion layer 350 can change the color of light to be emitted differently from the color of the incident light L3. The wavelength conversion layer 350 may include first, second, and third wavelength conversion layers 351, 352, and 354. The wavelength conversion layer 350 may be disposed in the first pixel PX1, the second pixel PX2, and the first subpixel SPX1 of the fourth pixel PX4. The first wavelength conversion layer 351 may be disposed in the first pixel PX1 to at least partially overlap with the first color filter 321. The second wavelength conversion layer 352 may be disposed in the second pixel PX2 to at least partially overlap with the second color filter 322. The third wavelength conversion layer 354 may not overlap with any color filter layer 320 and may be disposed in the first subpixel SPX1 of the fourth pixel PX4.

The first wavelength conversion layer 351 may include a first light-transmitting resin 351b and a first wavelength conversion material 351a dispersed in the first light-transmitting resin 351b. The material of the first light-transmitting resin 351b is not particularly limited as long as it has excellent dispersion characteristic with respect to the first wavelength conversion material 351a and light transmission characteristic. For example, the first light-transmitting resin 351b, like the third light-transmitting resin 353b, may include an acrylic resin, an imide resin, or an epoxy resin.

The first wavelength conversion material 351a may absorb the incident light L3, which is provided by the light-emitting layer 230, and may convert the incident light L3 into light L1 having the first wavelength band. The incident light L3 may be near ultraviolet light or ultraviolet light having a shorter wavelength than light of the third wavelength band. Accordingly, the first pixel PX1 may display red light. The first wavelength conversion material 351a may be, for example, a quantum dot material, a quantum rod material, or a phosphor material. Quantum dots may emit light of a particular color in response to the transition of their electrons from the conduction band to the valence band. In the description that follows, it is assumed that the first wavelength conversion material 351a includes the quantum dot material.

The quantum dot material may be a semiconductor nanocrystal material. The quantum dot material may have a particular band gap depending on its composition or size. The quantum dot material may absorb light and may then emit light of a particular wavelength. Examples of the semiconductor nanocrystal material include a group IV nanocrystal material, a group II-VI compound, a group III-V compound, a group IV-VI compound, or a combination thereof.

For example, the group IV nanocrystal material may be silicon (Si), germanium (Ge), or a binary compound such as silicon carbide (SiC) or silicon germanium (SiGe), but the present disclosure is not limited thereto.

Also, the group II-VI compound may be a binary compound such as CdSe, CdTe, ZnS, ZnSe, ZnTe, ZnO, HgS, HgSe, HgTe, MgSe, MgS, or a mixture thereof, a ternary compound such as InZnP, AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a mixture thereof, or a quaternary compound such as HgZnTeS, CdZnSeS, CdZnSeTe, CdZnSTe, CdHgSeS, CdHgSeTe, CdHgSTe, HgZnSeS, HgZnSeTe, HgZnSTe, or a mixture thereof, but the present disclosure is not limited thereto.

Also, the group III-V compound may be a binary compound such as GaN, GaP, GaAs, GaSb, AlN, AlP, AlAs, AlSb, InN, InP, InAs, InSb, or a mixture thereof, a ternary compound such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, or a mixture thereof, or a quaternary compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a mixture thereof, but the present disclosure is not limited thereto.

Also, the group IV-VI compound may be a binary compound such as SnS, SnSe, SnTe, PbS, PbSe, PbTe, or a mixture thereof, a ternary compound such as SnSeS, SnSeTe, SnSTe, PbSeS, PbSeTe, PbSTe, SnPbS, SnPbSe, SnPbTe, or a mixture thereof, or a quaternary compound such as SnPbSSe, SnPbSeTe, SnPbSTe, or a combination thereof, but the present disclosure is not limited thereto.

The type of the quantum dot material is not particularly limited. For example, the quantum dot material may be spherical, pyramid, multi-arm, or cubic nanoparticles, nanotubes, nanowires, nanofibers, or nanoplatelets. The binary element compound, the ternary element compound, or the quaternary element compound may be respectively included in the quantum dot material at a uniform concentration or at partially different concentrations. The quantum dot material may have a core-shell structure in which one quantum dot surrounds another quantum dot. The concentration of the element present in the shell gradually decreases toward the core.

In some embodiments, the quantum dot material may have a core-shell structure and may include a core comprising the aforementioned nanocrystal material and a shell surrounding the core.

The shell of the quantum dot material may perform the functions of a protective layer for preventing chemical denaturation of the core to maintain semiconductor characteristics and/or the functions of a charging layer for imparting electrophoretic characteristics to the quantum dot material. The shell of the quantum dot material may have a single- or multilayer structure. Examples of the shell of the quantum dot material include an oxide of a metal or nonmetal, a semiconductor compound, and a combination thereof.

For example, the metal or nonmetal oxide may be a binary compound such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, or $NiO$ or a ternary compound such as $MgAl_2O_4$, $CoFe_2O_4$, $NiFe_2O_4$, or $CoMn_2O_4$, but the present disclosure is not limited thereto.

Also, the semiconductor compound may be CdS, CdSe, CdTe, ZnS, ZnSe, ZnTe, GaAs, GaP, GaSb, HgS, HgSe, HgTe, InAs, InP, InSb, AlAs, AlP, or AlSb, but the present disclosure is not limited thereto.

The second wavelength conversion layer 352 may include a second light-transmitting resin 352b and a second wavelength conversion material 352a dispersed in the second light-transmitting resin 352b. The material of the second light-transmitting resin 352b is not particularly limited as long as it neither affects the wavelength conversion performance of the second wavelength conversion material 352a, nor causes light absorption. For example, the second light-transmitting resin 352b may include an organic material such as an epoxy resin or an acrylic resin. The first, second, and third light-transmitting resins 351b, 352b, and 353b may all be formed of the same material, but the present disclosure is not limited thereto.

The second wavelength conversion material 352a may absorb the incident light L3, which is provided by the light-emitting layer 230, and may then emit light L2 of the second wavelength band having the second color. Accordingly, the second pixel PX2 may display green light. The second wavelength conversion material 352a may be, for example, the quantum dot material, the quantum rod material, or the phosphor material. In the description that follows, it is assumed that the second wavelength conversion material 352a includes the quantum dot material. The quantum dot material may have a core-shell structure. The core of the quantum dot material may be a semiconductor nanocrystal material. In one embodiment, the semiconductor nanocrystal material may be selected from a group consisting of a group II-VI compound, a group III-V compound, a group IV-VI compound, a group IV element, a group IV compound, and a combination thereof. Examples of each of these compounds or elements have already been described above with regard to the first wavelength conversion material 351a, and thus, detailed descriptions thereof will be omitted.

The quantum dot size (or particle size) of the first wavelength conversion material 351a may be greater than the quantum dot size (or particle size) of the second wavelength conversion material 352a. For example, the first wavelength conversion material 351a may have a quantum dot size of about 55 Å about to 65 Å and the second wavelength conversion material 351a may have a quantum dot size of about 40 Å to about 50 Å.

The quantum dot material may have a full width at half maximum (FWHM) emission spectrum of about 45 nm or less, preferably about 40 nm or less, and more preferably about 30 nm or less, in which case, color purity or color reproducibility can be improved. Also, because light can be emitted in all directions through the quantum dot material, side visibility can be improved.

Light emitted from the first wavelength conversion layer 351 and light emitted from the second wavelength conversion layer 352 may both be in an unpolarized state. Unpolarized light refers to light that vibrate in a variety of direction. In other words, unpolarized light is light consisting of random polarization components. An example of unpolarized light is natural light.

Alternatively, the first and second wavelength conversion layers 351 and 352 may include not only the quantum dot material but also the phosphor material. In one embodiment, the phosphor material may have a size of about 100 nm to 3000 nm The phosphor material may include yellow, green, and red fluorescent materials.

Light that is not converted by the first or second wavelength converting materials 351a or 352a among beams of light transmitted through the first or second wavelength conversion layers 351 or 352 may be absorbed by the color filter layer 320. For example, all the beams of light transmitted through the first wavelength conversion layer 351, except for red light, may be absorbed by the first color filter 321 and may thus be blocked. Accordingly, the purity of red light displayed by the first pixel PX1 can be further improved.

The third wavelength conversion layer 354 may include a fourth light-transmitting resin 354b and the first and second wavelength conversion materials 351a and 352a which are dispersed in the fourth light-transmitting resin 354b. The first wavelength conversion material 351a may convert the incident light L3 into light of the first wavelength band and may emit the light of the first wavelength band, and the second wavelength conversion material 352a may convert the incident light into light of the second wavelength band and may emit the light of the second wavelength band . Some of the incident light L3 may be transmitted through the third wavelength conversion layer 354 without being converted by the first and second wavelength conversion materials 351a and 352a. That is, the third wavelength conversion layer 354 may emit light of the first wavelength band, light of the second wavelength band, and light of the third wavelength band. Because the first subpixel SPX1 of the fourth pixel PX4 does not include the color filter layer 320, the light of the first wavelength band, the light of the second wavelength band, and the light of the third wavelength band emitted from the third wavelength conversion layer 354 can be provided to the outside of the display device 10. In a case where the incident light L3 is blue light, red light, green light, and blue light may be emitted to the outside through the first subpixel SPX1. In a case where the red light, the green light, and the blue light are mixed and emitted together, light L4 of the fourth color may be emitted. The light L4 may be white light. That is, the first subpixel SPX1 may be a pixel displaying white light. The light emitted by the first subpixel SPX1 will be described later with reference to FIGS. 7 and 8.

In some embodiments, the wavelength conversion layer 350 may be formed after the formation of the light-transmitting layer 353. By forming the light-transmitting layer 353 and then the wavelength conversion layer 350, the wavelength conversion materials included in the wavelength conversion layer 350 can be prevented from being damaged or contaminated in the process of forming the light-transmitting layer 353.

The second capping layer 360 may be disposed on the wavelength conversion layer 350 and the light-transmitting layer 353. The second capping layer 360 may be disposed along the surfaces of the first wavelength conversion layer 351, the second wavelength conversion layer 352, the light-transmitting layer 353, and the third wavelength conversion layer 354 to have a uniform thickness. The second capping layer 360 may also be disposed on the fourth color filter 324, which is disposed in the second subpixel SPX2 of the fourth pixel PX4, particularly, on the first capping layer 340 on the fourth color filter 324. The second capping layer 360 may be formed on the entire surface of the second substrate 300. The second capping layer 360 may be formed of an inorganic material such as silicon oxide, silicon oxynitride, or silicon nitride. The second capping layer 360, like the first capping layer 340, can prevent the color filter layer 320 and the wavelength conversion layer 350 from being damaged or deformed due to the infiltration of external impurities such as moisture or air.

Although not specifically illustrated, a yellow reflection filter (YRF) layer may be disposed on the second capping layer 360. The YRF layer may be a layer that transmits blue light therethrough and reflects green light and red light. That is, the YRF layer may transmit the incident light L3 from the light provider 200 therethrough and may reflect light traveling toward the light-emitting layer 230 so that light efficiency emitted to the outside may be increased. Accordingly, the emission efficiency of the display device 10 can be improved by the YRF layer. The YRF layer may be formed by alternately stacking a high refractive index material layer and a low refractive index material layer. In one embodiment, the high refractive index material layer may include SiNx, TiOx, TaOx, HfOx, or ZrOx, and the low refractive index material layer may include SiOx or SiCOx. For example, the YRF layer may be formed by alternately depositing SiNx, which is a high refractive index material, and SiOx, which is a low refractive index material, but the present disclosure is not limited thereto. In some embodiments, the YRF layer may not be provided.

The filler layer 400 may be disposed between the light converter 301 and the light provider 200. The filler layer 400 may transmit light emitted from the light provider 200 and may serve as a buffer for stably bonding the light converter 301 and the light provider 200. The filler layer 400 may include an organic material such as a silicon-based organic material, an epoxy-based organic material, or an epoxy-acrylic-based organic material. For example, the filler material may include silicone rubber.

A sealing member (not illustrated) may be further disposed along the edges of each of the light converter 301 and the light provider 200 in a plan view. The sealing member may include an organic material such as an epoxy resin, but the present disclosure is not limited thereto.

In some embodiments, the filler layer 400 may not be provided. In a case where the filler layer 400 is not provided, an air layer may be disposed between the light converter 301 and the light provider 200. Alternatively, a gap between the light converter 301 and the light provider 200 may be filled with an inert gas. Still alternatively, the gap between the light converter 301 and the light provider 200 may be in vacuum state.

In the display device 10, the first and second substrates 100 and 300 are used so that the light provider 200 and the light converter 301 can be separated. However, in other embodiments, the display device 10 may be formed using a single substrate, in which case, the light provider 200 and the light converter 301 may be sequentially stacked on the single substrate to form the display device 10.

FIG. 3 is a cross-sectional view illustrating the second subpixel SPX2. Referring to FIG. 3, the second subpixel SPX2 of the fourth pixel PX4 may not include the light-emitting layer 230 and the wavelength conversion layer 350. That is, since the second subpixel SPX2 may not include the light-emitting layer 230, the second subpixel SPX2 may be a region that does not emit light. The second subpixel SPX2 may be a region for controlling reflected light from the display device 10. Specifically, the second subpixel SPX2 may include the fourth color filter 324 and may be a region for reflecting blue light.

FIG. 4 is a cross-sectional view illustrating the first and second subpixels SPX1 and SPX2 of the fourth pixel PX4. Referring to FIG. 4, the first subpixel SPX1 may receive the incident light L3 and may then display beams of the first and second colors through the first and second wavelength conversion materials 351a and 352a of the third wavelength conversion layer 354, respectively. As already mentioned above, incident light L3 which is not converted into light having different wavelengths by the third wavelength conversion layer 354 may be mixed with the beams of the first and second colors and may thus be emitted as white light. In a case where the first subpixel SPX1 emits white light, the full white luminance of the display device 10 can be improved. Also, the power consumption of the display device 10 for emitting white light can be reduced.

However, because the first subpixel SPX1 does not include a color filter layer, the first subpixel SPX1 may have poor reflection properties. Specifically, external light incident upon the first subpixel SPX1 may be converted by the first and second wavelength conversion materials 351a and 352a of the third wavelength conversion layer 354 and may thus be viewed by the user. That is, the third wavelength conversion layer 354 in the first subpixel SPX1 may emit the light L1 and the light L2 reflected by the first and second wavelength conversion materials 351a and 352a of the third wavelength conversion layer 354. As a result, even when the display device is not driven, the display device 10 may emit the light L1 and the light L2, and the light L1 and the light L2 may be viewed to the user thus a color other than black may be recognized by the user due to external light. A phenomenon in which the display device 10 is viewed as black when the display device is not driven is referred to as neutral black (NB) reflection. Light transmitted through the fourth pixel PX4 will hereinafter be described with reference to FIGS. 5 and 6, and light reflected from the fourth pixel PX4 will hereinafter be described with reference to FIGS. 7 through 9.

Although not specifically illustrated, in some embodiments, some elements of the light-emitting layer 230 may be divided for each of the plurality of pixels (PX1, PX2, PX3, and PX4), and other elements of the light-emitting layer 230 may be formed integrally for all the plurality of pixels (PX1, PX2, PX3, and PX4), as illustrated in FIGS. 2 through 4. For example, the active layer 232 of the light-emitting layer 230 may be divided for each of the plurality of pixels (PX1, PX2, PX3, and PX4), but the first and second auxiliary layers 231 and 233 of the light-emitting layer 230 may be formed integrally on the entire surface of the first substrate 100. Alternatively, the entire light-emitting layer 230 may be formed integrally on the entire surface of the first substrate 100 for all the plurality of pixels (PX1, PX2, PX3, and PX4). Even if the light-emitting layer 230 is formed integrally for all the plurality of pixels (PX1, PX2, PX3, and PX4), the light-emitting layer 230 may not be disposed in the second subpixel SPX2. However, the arrangement of the light-emitting layer 230 is not particularly limited.

Figure 25:
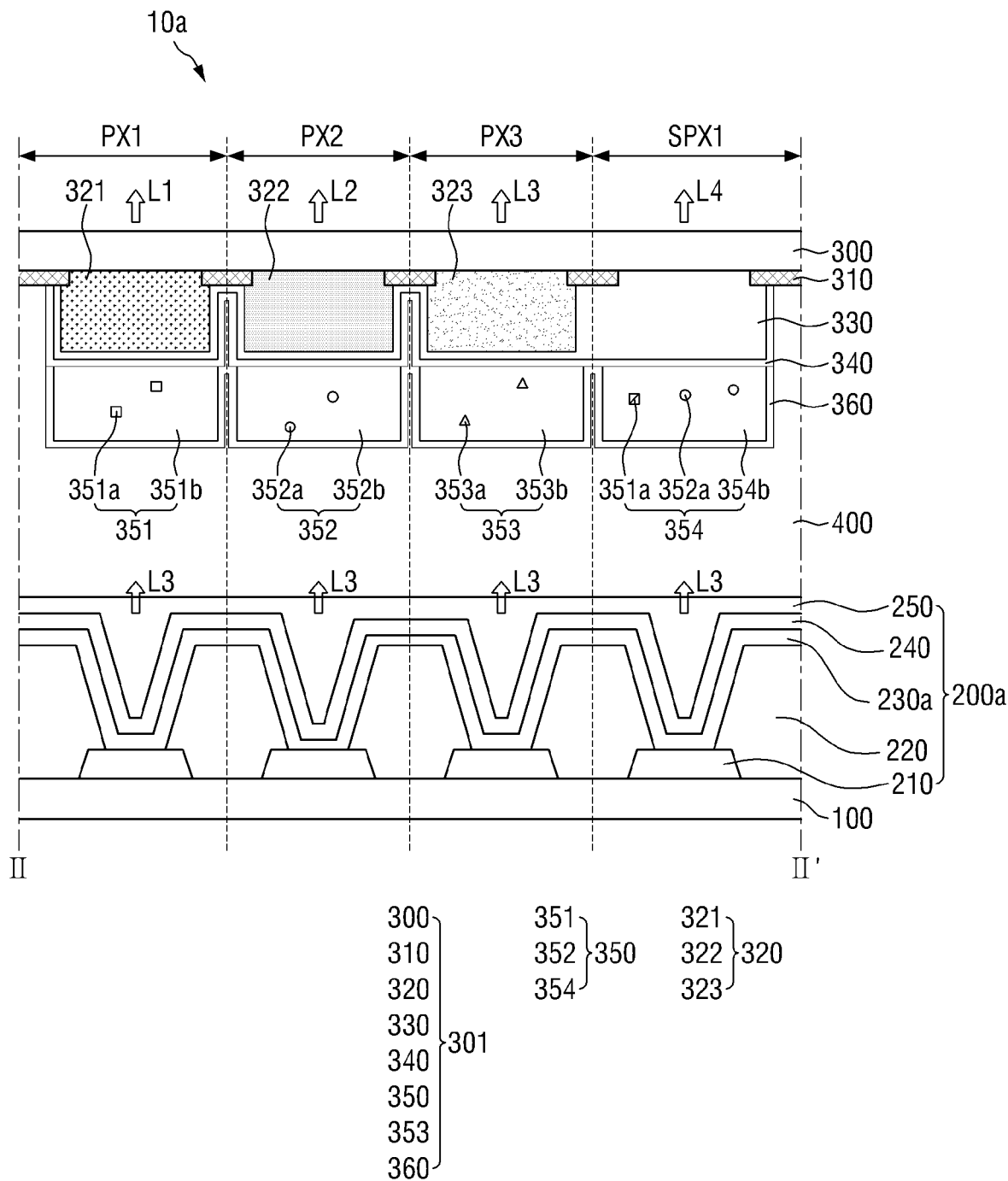
FIG. 25 is a cross-sectional view illustrating a modified example of FIG. 2.
Figure 26:
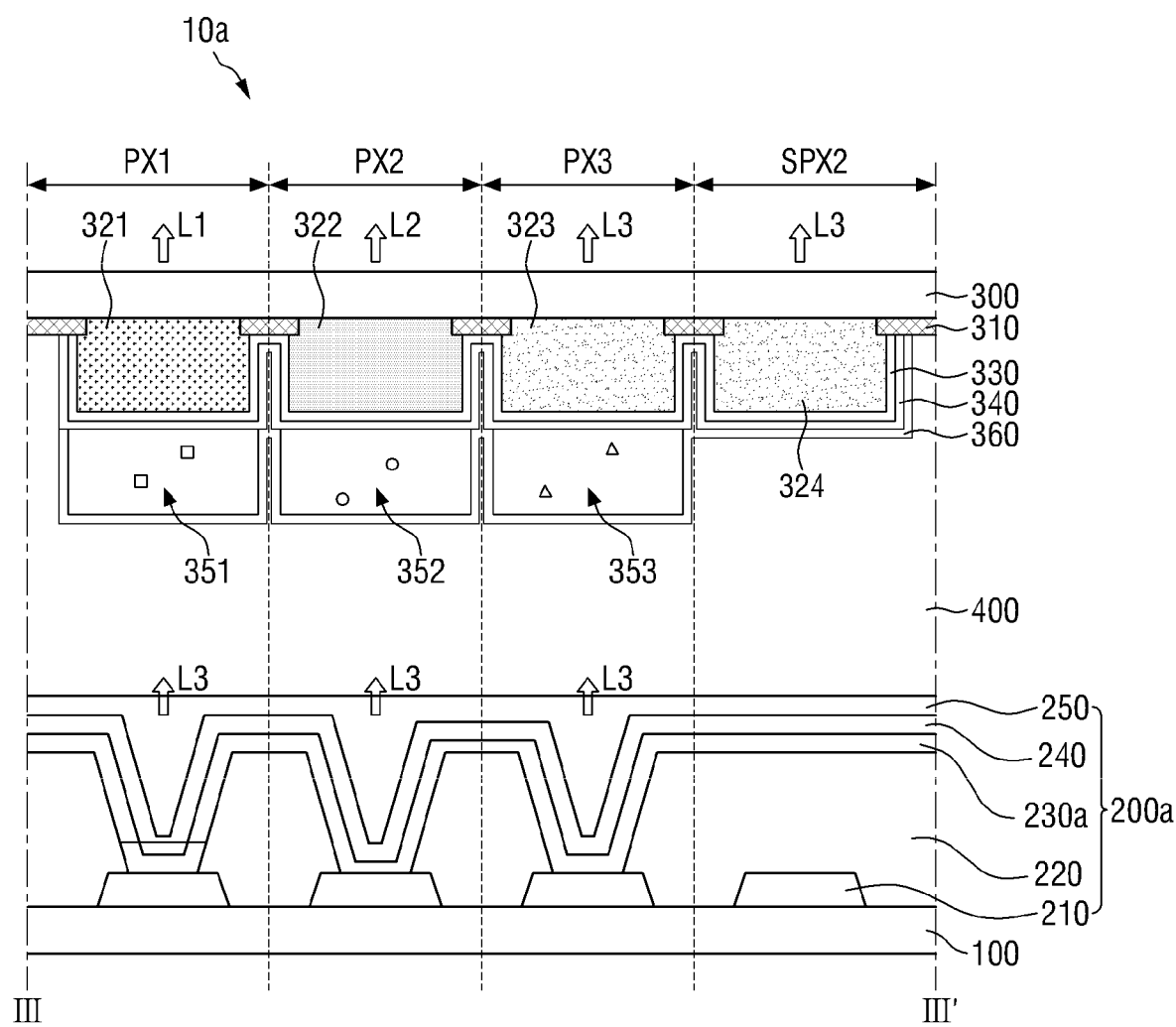
FIG. 26 is a cross-sectional view illustrating a modified example of FIG. 3.
Figure 27:
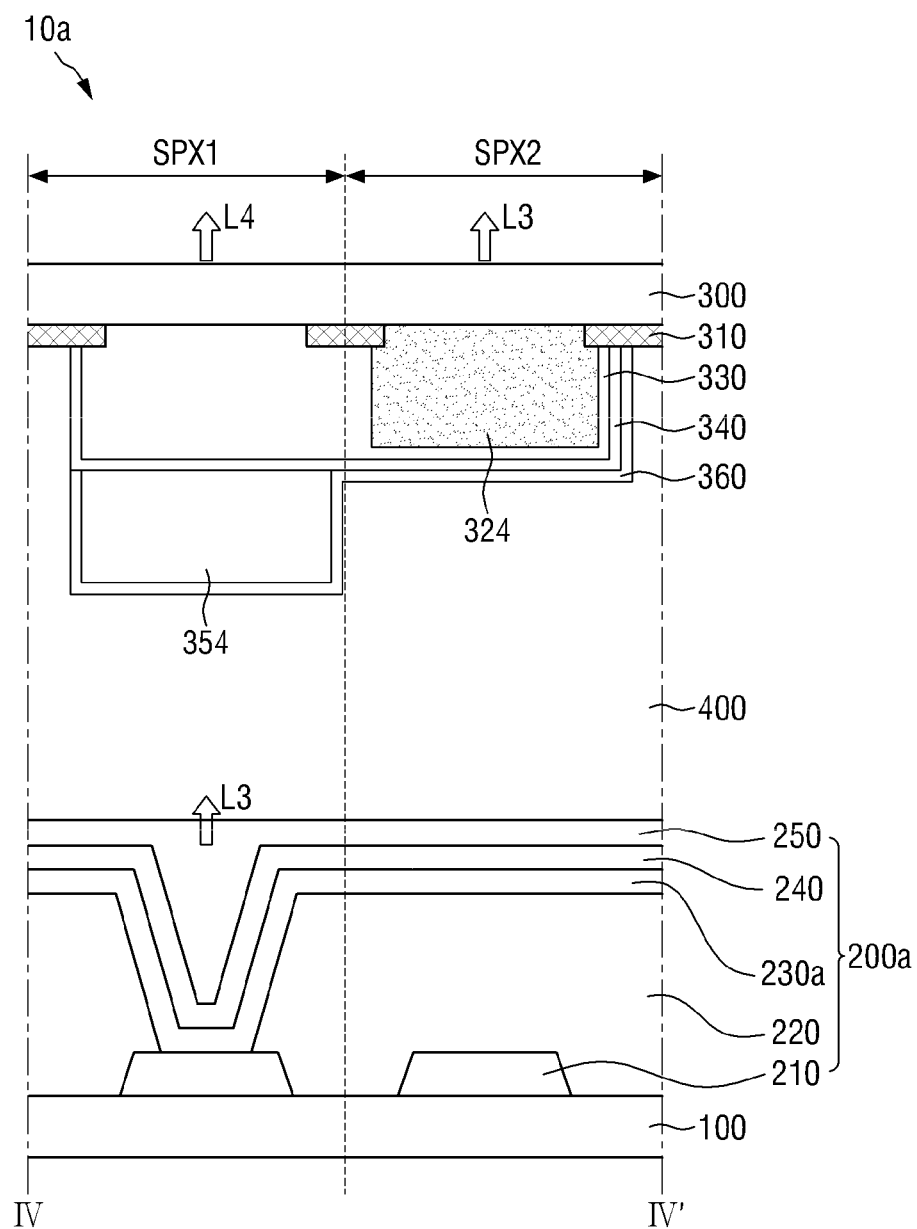
FIG. 27 is a cross-sectional view illustrating a modified example of FIG. 4.

FIG. 25 is a cross-sectional view illustrating a modified example of FIG. 2, FIG. 26 is a cross-sectional view illustrating a modified example of FIG. 3, and FIG. 27 is a cross-sectional view illustrating a modified example of FIG. 4.

Referring to FIGS. 25 through 27, a light-emitting layer 230a of a light provider 200a may be formed on the entire surface of a first substrate 100 of a display device 10a. Specifically, the light-emitting layer 230a may be disposed in common for first, second, and third pixels PX1, PX2, and PX3 and first and second subpixels SPX1 and SPX2 of a fourth pixel PX4 and may be further disposed on a pixel defining film 220. In the first, second, and third pixels PX1, PX2, and PX3 and the first subpixel SPX1 of the fourth pixel PX4, the light-emitting layer 230a may be in contact with first electrodes 210 and a second electrode 240. In the second subpixel SPX2 of the fourth pixel PX4, the light-emitting layer 230a may be in contact with the second electrode 240 but may not contact with the first electrodes 210. Accordingly, in the second subpixel SPX2 of the fourth pixel PX4, the light-emitting layer 230a may not emit light. The light-emitting layer 230a, like the light-emitting layer 230 of FIGS. 2 through 4, may include a first auxiliary layer, an active layer, and a second auxiliary layer.

Figure 5:
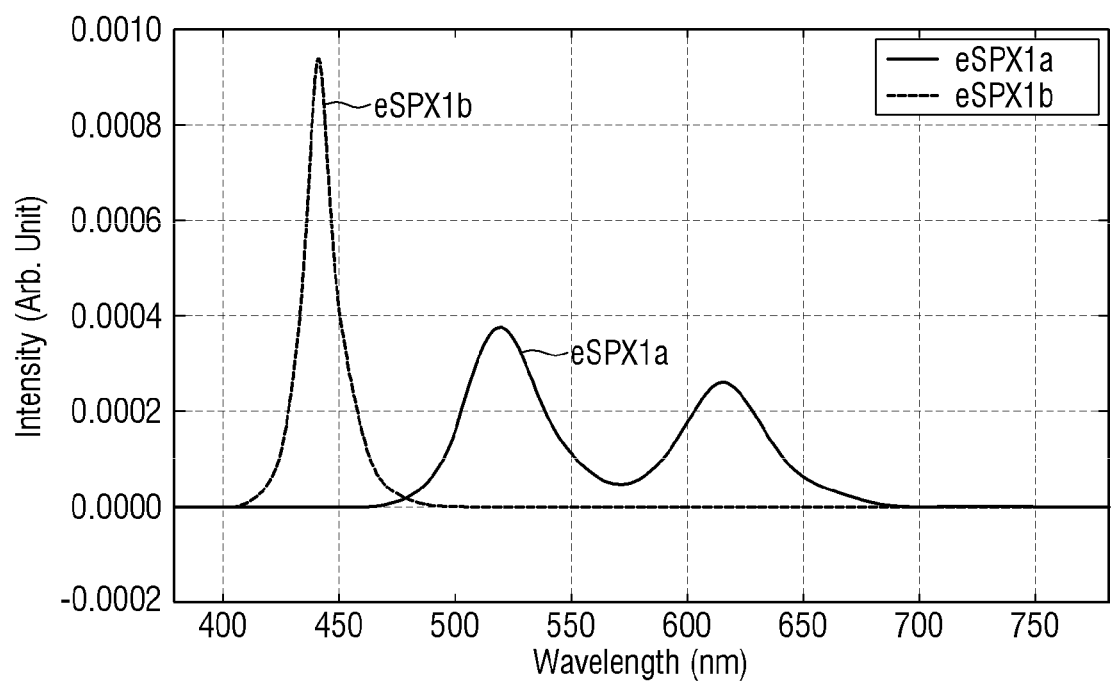
FIG. 5 shows the light transmission spectrum of a first subpixel according to an embodiment of the present disclosure.
Figure 6:
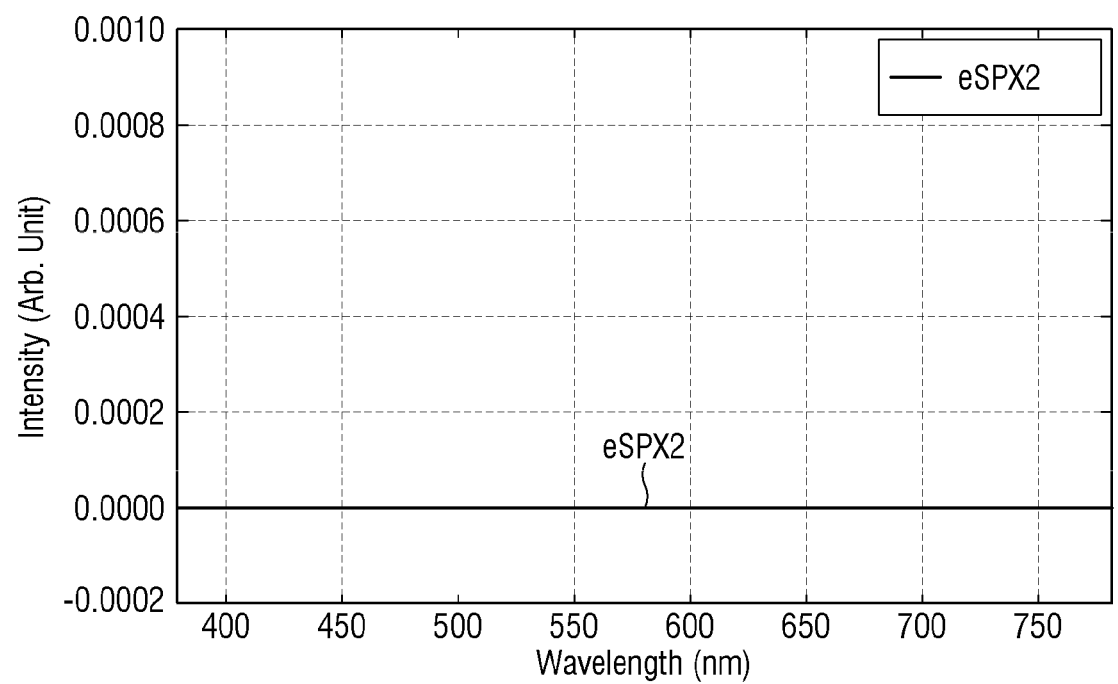
FIG. 6 shows the light transmission spectrum of a second subpixel according to an embodiment of the present disclosure.

FIG. 5 shows the light transmission spectrum of the first subpixel SPX1 according to an embodiment of the present disclosure. FIG. 6 shows the light transmission spectrum of the second subpixel SPX2 according to an embodiment of the present disclosure.

Referring to FIG. 5, the light transmission spectrum of the first subpixel SPX1 may include a converted light transmission spectrum eSPX1a corresponding to light converted by the first and second wavelength conversion materials 351a and 352a, and a light transmission spectrum eSPX1b corresponding to light which is not converted by the first and second wavelength conversion materials 351a and 352a. The converted light transmission spectrum eSPX1a may include green light in the wavelength band of 500 nm to 570 nm and red light in the wavelength band of 600 nm to 670 nm. The light transmission spectrum eSPX1b may include blue light in the wavelength band of 420 nm to 480 nm. The intensity of the transmitted light may be greater than the intensity of the converted light. Light transmitted through the first subpixel SPX1 may be mixed light into which red light, green light, and blue light are mixed. The intensity of the transmitted light, which has the third wavelength band, is greater than the intensities of light of the first wavelength band and light of the second wavelength band, but may be less detectable than the intensities of light of the first wavelength band and light of the second wavelength band. That is, the converted light transmission spectrum eSPX1a and the light transmission spectrum eSPX1b may be appropriately mixed to form a mixed light transmission spectrum, and the mixed light may be white light. For example, if the thickness of the third wavelength conversion layer 354 is 6 μm or less, an appropriate amount of transmitted light may be transmitted through the third wavelength conversion layer 354. That is, the first subpixel SPX1 may emit white light. On the other hand, if the thickness of the third wavelength conversion layer 354 is 6 μm or greater, white light may not be able to be emitted solely by the first subpixel SPX1 because a sufficient amount of transmitted light cannot be secured. Thus, white light may be realized by adding the second subpixel SPX2 which transmits light having the third wavelength band.

Referring to FIG. 6, the intensity of a light transmission spectrum eSPX2 of the second subpixel SPX2 may be substantially zero. That is, there exists substantially no light transmitted through the second subpixel SPX2. The second subpixel SPX2 is a region that does not include the light-emitting layer 230 and is not provided with light by the light provider 200. In a case where the first subpixel SPX1 emits white light, the second subpixel SPX2 may be a region for correcting the color coordinates of reflected light without emitting light. Alternatively, the intensity of the light transmission spectrum eSPX2 of the second subpixel SPX2 may not be zero, and this will be described later with reference to FIGS. 13 and 14.

The fourth pixel PX4 may emit white light through the first subpixel SPX1. However, in a case where the first subpixel SPX1 is provided, NB reflection may not be realized due to reflected light caused by external light. The fourth pixel PX4 may further include the second subpixel SPX2 and may thus be able to realize NB reflection. The fourth pixel PX4 may correct the color coordinates of reflected light with the second subpixel SPX2. It will hereinafter be described how the fourth pixel PX4 can correct the color coordinates of reflected light with the second subpixel SPX2 with reference to FIGS. 7 through 9.

Figure 7:
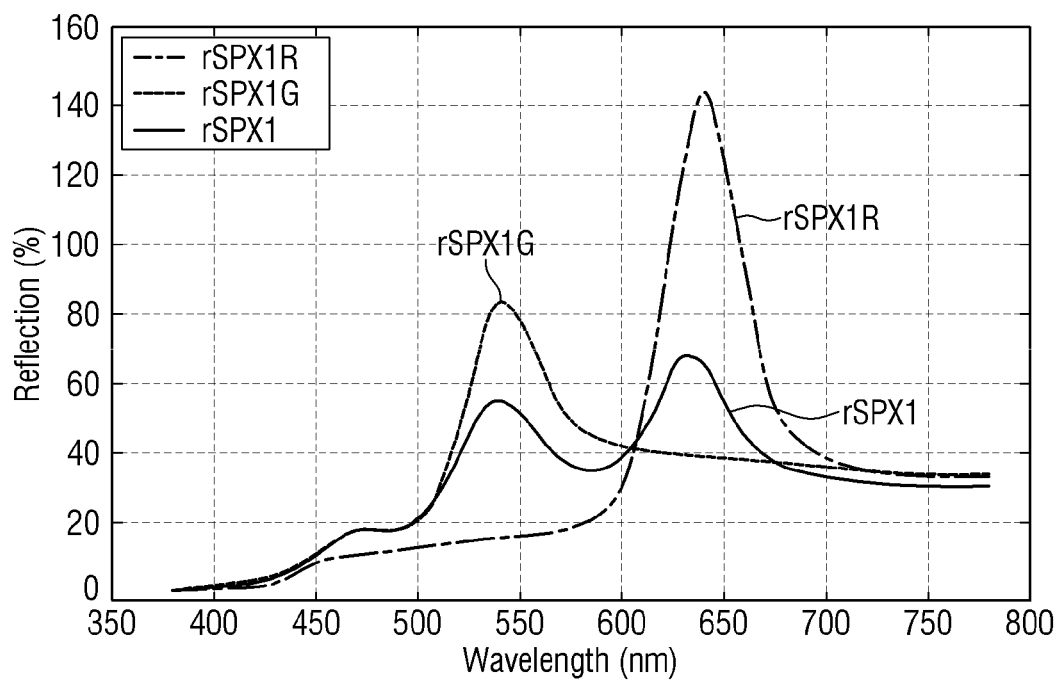
FIG. 7 shows the light reflection spectrum of the first subpixel according to an embodiment of the present disclosure.
Figure 8:
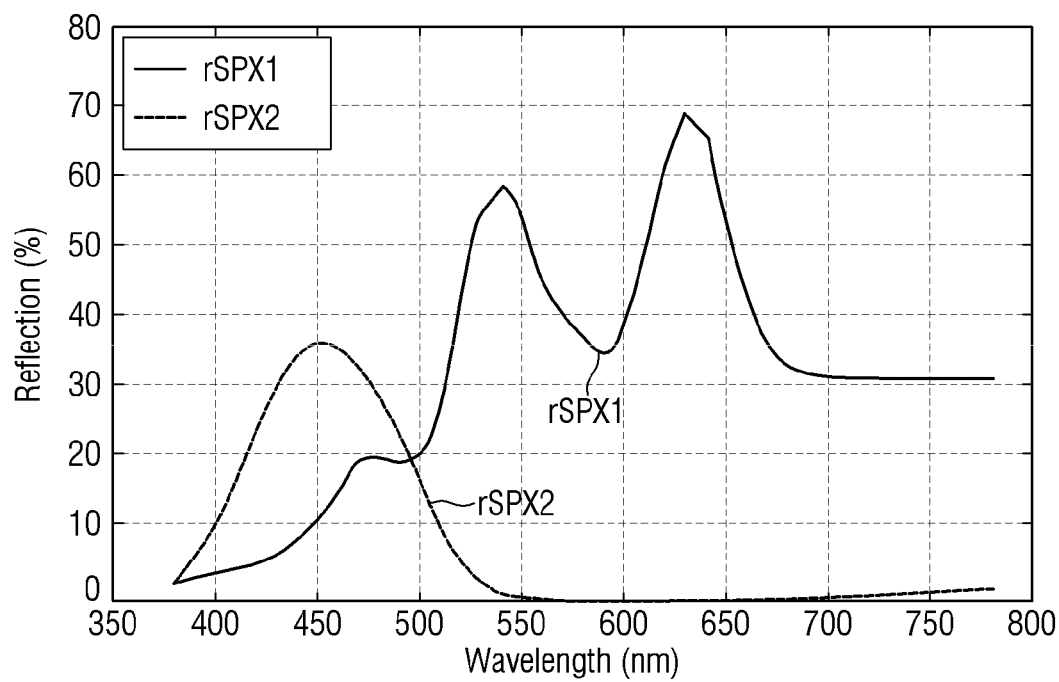
FIG. 8 shows the light reflection spectrum of the second subpixel according to an embodiment of the present disclosure.
Figure 9:
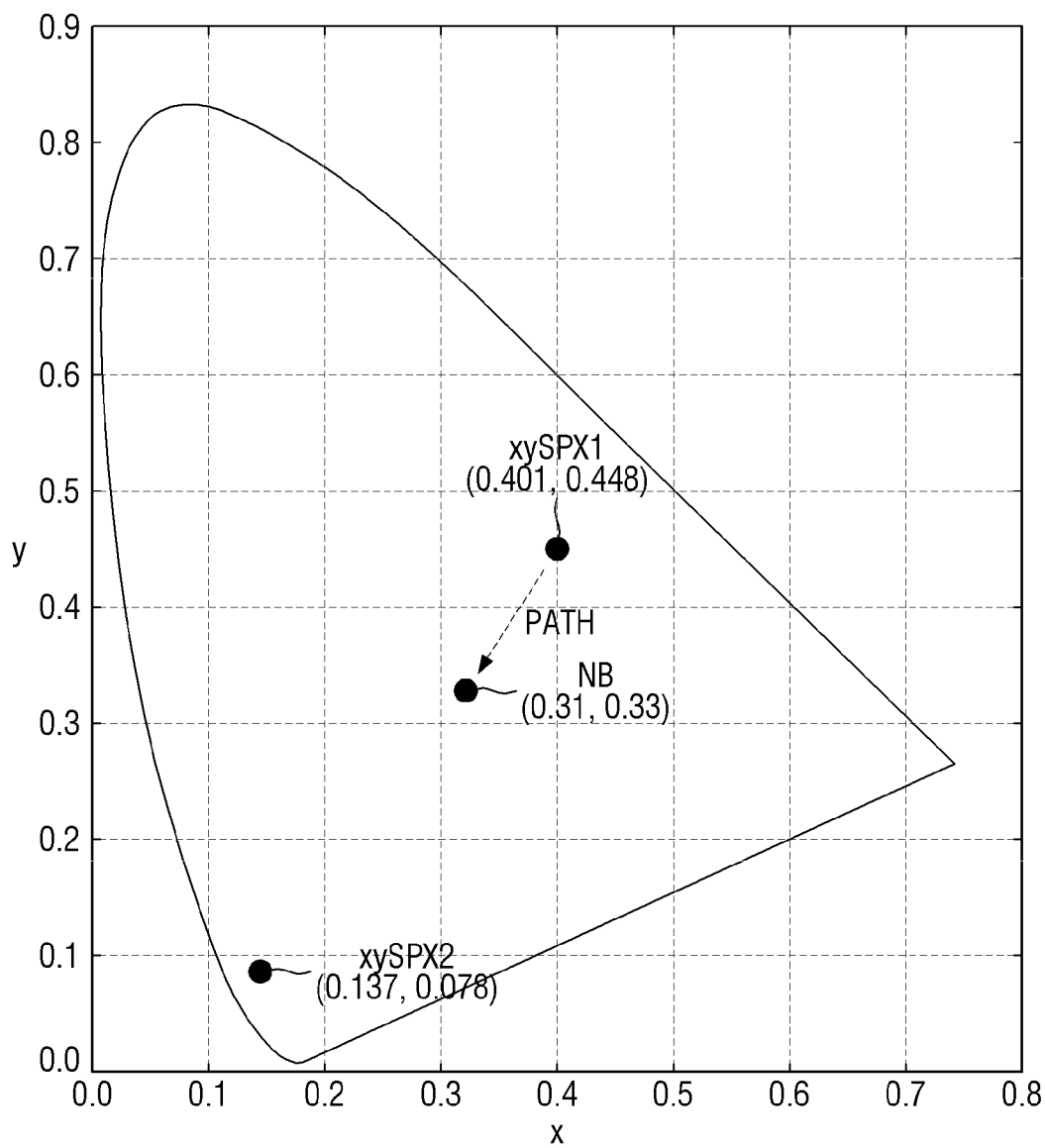
FIG. 9 is a CIE 1931 chromaticity diagram showing the color coordinates of reflected light.

FIG. 7 shows the light reflection spectrum of the first subpixel SPX1 according to an embodiment of the present disclosure. FIG. 8 shows the light reflection spectrum of the second subpixel SPX2 according to an embodiment of the present disclosure. FIG. 9 is a CIE 1931 chromaticity diagram showing the color coordinates of reflected light. External light for realizing a light reflection spectrum may be light having a color temperature of 6504 K (i.e., D65 light). D65 light may be white light having color coordinates of (0.31, 0.33). The light reflection spectrums of FIGS. 7 and 8 may be for D65 light.

Referring to FIG. 7, a light reflection spectrum rSPX1 of the first subpixel SPX1 includes a first light reflection spectrum rSPX1R and a second light reflection spectrum rSPX1G. As already described above with reference to FIG. 2, the first subpixel SPX1 may include the first and second wavelength conversion materials 351a and 352a. The first wavelength conversion material 351a may receive external light and may then reflect light of the first wavelength band. The second wavelength conversion material 352a may receive external light and may then reflect light of the second wavelength band. The light of the first wavelength band may be red light, and the light of the second wavelength band may be green light. The light reflection spectrum rSPX1 of the first subpixel SPX1 may be expressed by the combination of the first light reflection spectrum rSPX1R and the second light reflection spectrum rSPX1G. The light reflection spectrum rSPX1 of the first subpixel SPX1 may be a spectrum to which a correction value based on actual human visibility is applied. The light reflection spectrum rSPX1 of the first subpixel SPX1 may include green light in the wavelength band of 500 nm to 570 nm and red light in the wavelength band of 600 nm to 670 nm That is, reflected light from the first subpixel SPX1 may be composite light of green light and red light. Therefore, the reflected light from the first subpixel SPX1 may be yellow light. In a case where the reflected light from the first subpixel SPX1 is yellow light, the display device 10 may be recognized as being black mixed with yellow, rather than black. In this case, the light reflection spectrum of the fourth pixel PX4 can be corrected with the second subpixel SPX2 to realize NB reflection.

Referring to FIG. 8, the light reflection spectrum rSPX1 of the first subpixel SPX1 may have a different wavelength band from a light reflection spectrum rSPX2 of the second subpixel SPX2. As already mentioned above, the light reflection spectrum rSPX1 of the first subpixel SPX1 may include light of the first wavelength band and light of the second wavelength band. The light reflection spectrum rSPX2 of the second subpixel SPX2 may include a wavelength band of 420 nm to 480 nm which is blue light. The entire light reflection spectrum of the fourth pixel PX4 may be expressed by the combination of the light reflection spectrum rSPX1 of the first subpixel SPX1 and the light reflection spectrum rSPX2 of the second subpixel SPX2. The light reflection spectrum of the fourth pixel PX4 may be adjusted by varying the area ratio of the first subpixel SPX1 to the second subpixel SPX2. For example, when the first subpixel SPX1 is widened, the reflectance of green light in the wavelength band of 500 nm to 570 nm and red light in the wavelength band of 600 nm to 670 nm may increase. On the other hand, when the second subpixel SPX2 is widened, the reflectance of blue light in the wavelength band of 420 nm to 480 nm may increase. In one embodiment, the area ratio of the first subpixel SPX1 to the second subpixel SPX2 may be 1:1.4. However, the area ratio of the first subpixel SPX1 to the second subpixel SPX2 is not particularly limited as long as NB reflection of the display device 10 can be realized.

It will hereinafter be described how to realize NB reflection using the color coordinates of reflected light from the first subpixel SPX1 and the color coordinates of reflected light from the second subpixel SPX2 in a CIE 1931 chromaticity diagram.

FIG. 9 shows a CIE 1931 chromaticity diagram showing the color coordinates of reflected light from the first subpixel SPX1, the color coordinates of reflected light from the second subpixel SPX2, and the color coordinates of reflected light when NB reflection is realized.

Referring to FIG. 9, the color coordinates of reflected light from the first subpixel SPX1 may be first coordinates xySPX1, and the color coordinates of reflected light from the second subpixel SPX2 may be second coordinates xySPX2. The color coordinates of reflected light when NB reflection is realized may be third coordinates NB. The third coordinates NB may be located on a straight line connecting the first coordinates xySPX1 and the second coordinates xySPX2. For example, in a case where the fourth pixel PX4 does not include the second subpixel SPX2, the color coordinates of reflected light from the fourth pixel PX4 may be the same as the first coordinates xySPX1. On the other hand, in a case where the fourth pixel PX4 includes the second subpixel SPX2, the color coordinates of reflected light from the fourth pixel PX4 may be closer to the third coordinates NB. As the area of the second subpixel SPX2 increases, reflected light from the fourth pixel PX4 may become close to the third coordinates NB along a path "PATH". That is, NB reflection can be realized by controlling the area ratio of the first subpixel SPX1 to the second subpixel SPX2.

For example, the first coordinates xySPX1 may be (0.401, 0.448), the second coordinates xySPX2 may be (0.137, 0.078), and the third coordinates NB may be (0.31, 0.33). However, the present disclosure is not limited thereto. The first coordinates xySPX1 may be the color coordinates of a yellow-series color, and the second coordinates xySPX2 may be the color coordinates of a blue-series color.

The display device 10 may include the first, second, and third pixels PX1, PX2, and PX3 and may further include the fourth pixel PX4. The fourth pixel PX4 may include the first and second subpixels SPX1 and SPX2, and the first subpixel SPX1 may emit white light. The display device 10 can improve full-white luminance with the first subpixel SPX1. Also, the display device 10 can improve NB reflection with the second subpixel SPX2. The second subpixel SPX2 may reflect blue light. By controlling the area ratio of the first subpixel SPX1 to the second subpixel SPX2, the color coordinates of reflected light can be corrected, and as a result, NB reflection can be properly realized.

A display device 10_1 according to another embodiment of the present disclosure in which a second subpixel SPX2_1 includes a light-emitting layer 230_1 and light is transmitted through the second subpixel SPX2_1 will hereinafter be described with reference to FIGS. 10 through 14. Even when the second subpixel SPX2_1 includes the light-emitting layer 230_1, no light may be transmitted through the second subpixel SPX2_1 when the light-emitting layer 230_1 is not driven, because no light is provided to the second subpixel SPX2_1 from the light provider 200-1. In this case, the second subpixel SPX2_1 may be a region for correcting the color coordinates of reflected light. Descriptions of elements or features that have already been described above will be omitted, or at least simplified. The structure of the display device 10_1 will hereinafter be described with reference to FIGS. 10 through 12, focusing mainly on the differences with the display device 10.

Figure 10:
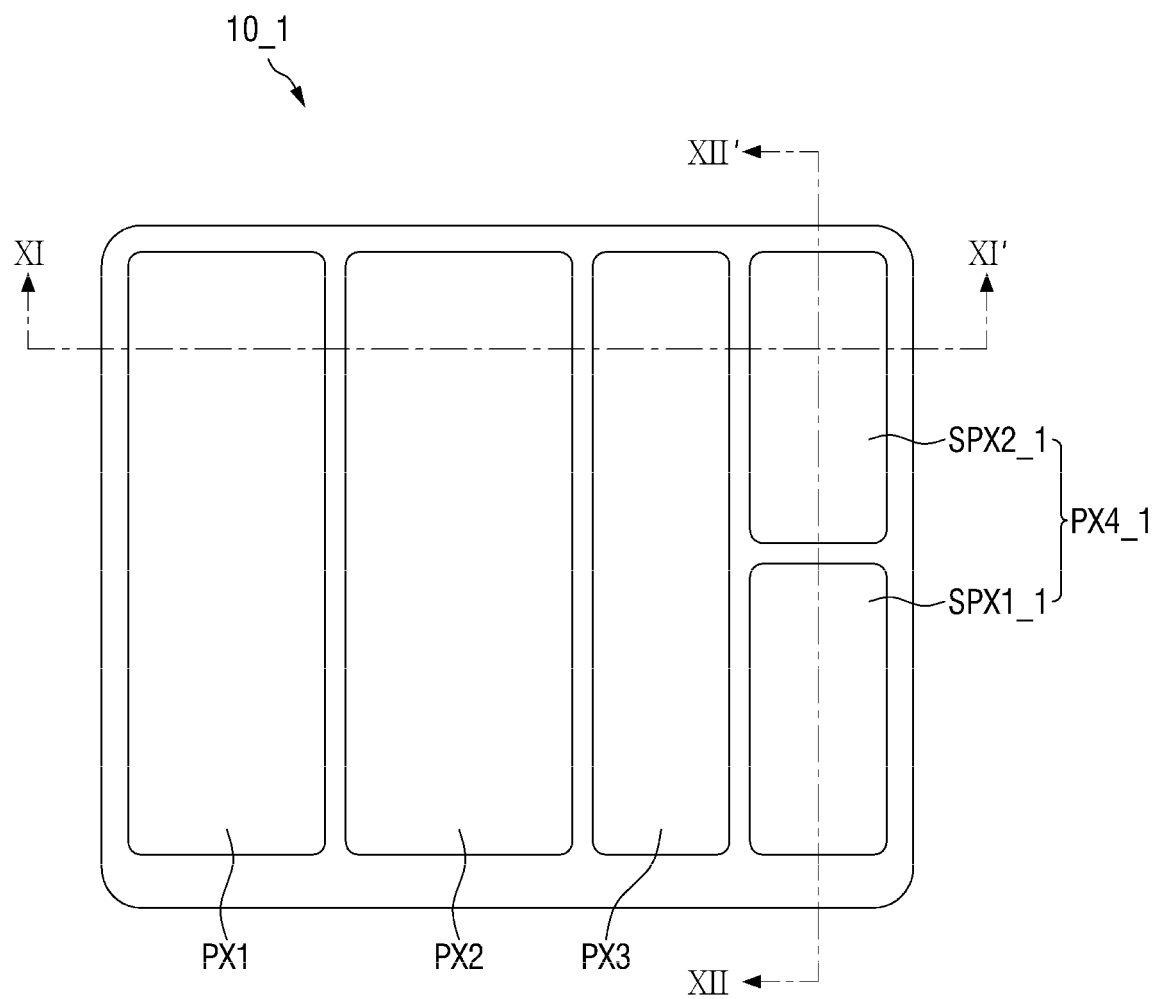
FIG. 10 is a plan view of a display device according to another embodiment of the present disclosure.
Figure 11:
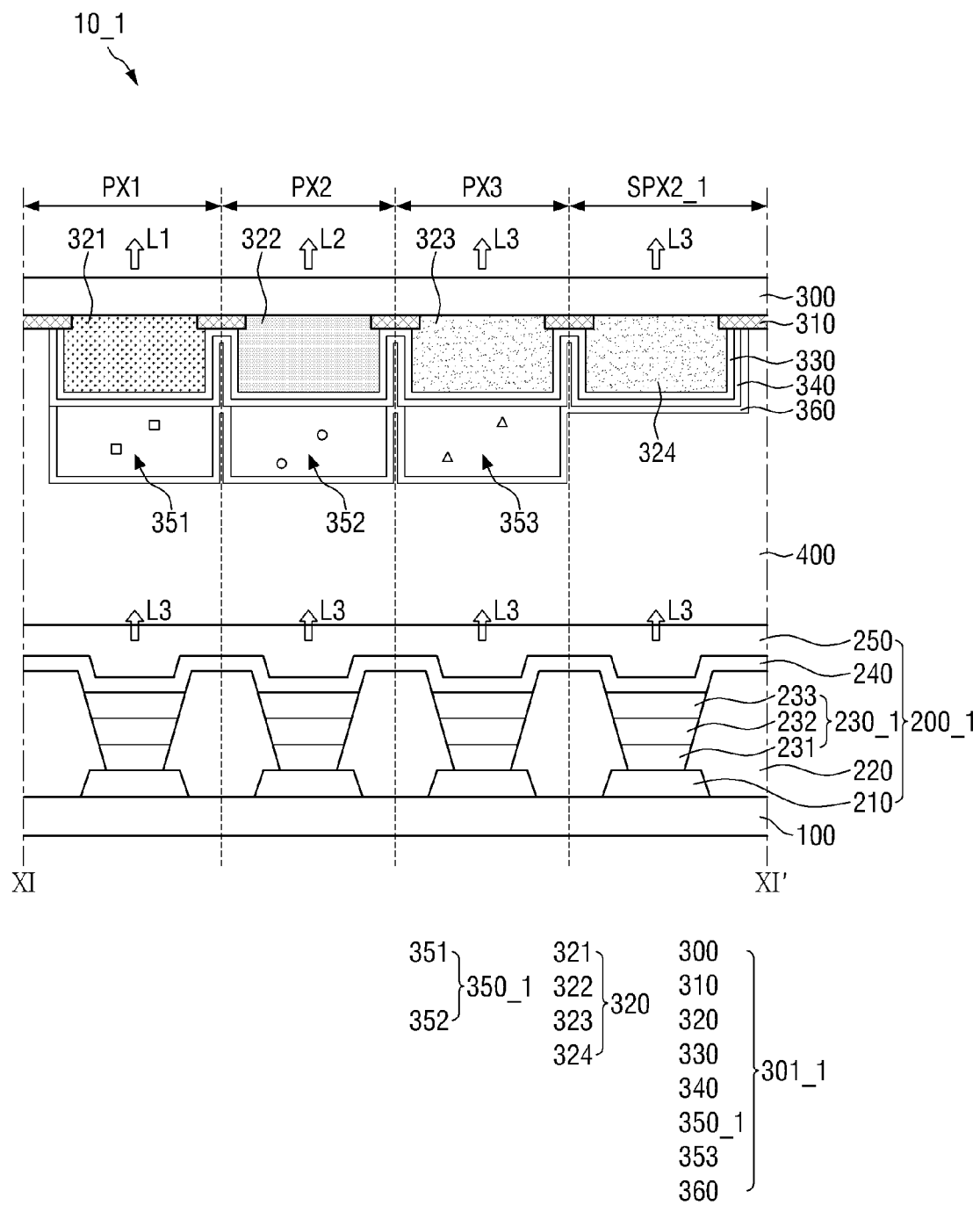
FIG. 11 is a cross-sectional view taken along line XI-XI' of FIG. 10.
Figure 12:
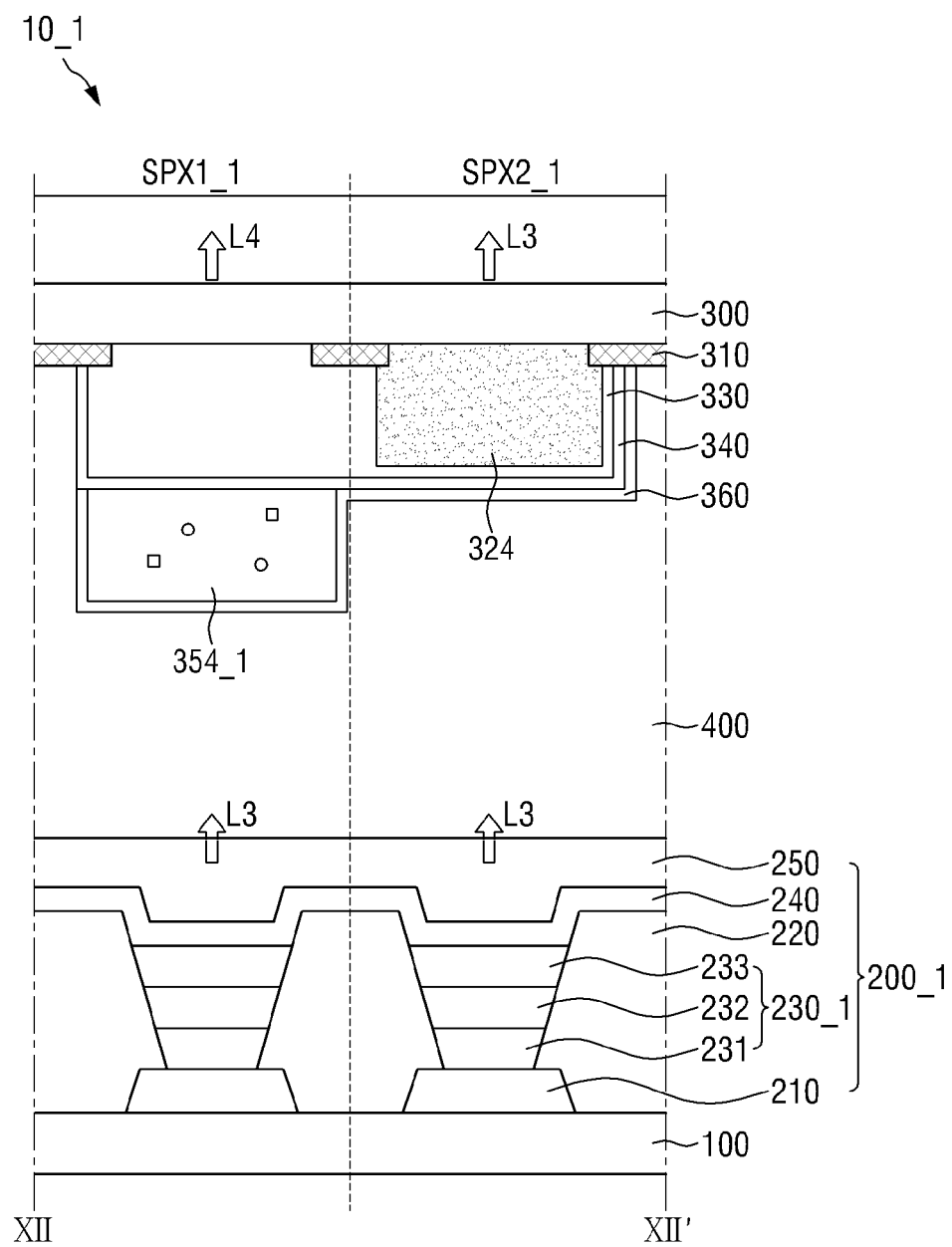
FIG. 12 is a cross-sectional view taken along line XII-XII' of FIG. 10.

FIG. 10 is a plan view of the display device 10_1. FIG. 11 is a cross-sectional view taken along line XI-XI' of FIG. 10. FIG. 12 is a cross-sectional view taken along line XII-XII' of FIG. 10.

Referring to FIGS. 10 through 12, the display device 10_1 may include a first pixel PX1, a second pixel PX2, a third pixel PX3, and a fourth pixel PX4_1. The fourth pixel PX4_1 may include a first subpixel SPX1_1 and the second subpixel SPX2_1. The first and second subpixels SPX1_1 and SPX2_1 may include the light-emitting layer 230_1. In one embodiment, separate light-emitting layers 230_1 may be disposed in the first and second subpixels SPX1_1 and SPX2_1, respectively. That is, the first and second subpixels SPX1_1 and SPX2_1 may be driven separately. In a case where the first and second subpixels SPX1_1 and SPX2_1 are driven separately, transmitted light from the fourth pixel PX4_1 can be delicately controlled. Alternatively, the first and second subpixels SPX1_1 and SPX2_1 may be provided with light by the same light-emitting layer 230_1. In a case where the first and second subpixels SPX1_1 and SPX2_1 are controlled at the same time, the design of driving circuitry and driving signals of the display device 10_1 can be simplified. Yet alternatively, the second subpixel SPX2_1 may be controlled by the same light-emitting layer 230_1 as the third pixel PX3.

In some embodiments, some elements of the light-emitting layer 230_1 may be divided for each of the first, second, third, and fourth pixels PX1, PX2, PX3, and PX4_1, as illustrated in FIGS. 11 and 12, and other elements of the light-emitting layer 230_1 may be formed integrally for all the first, second, third, and fourth pixels PX1, PX2, PX3, and PX4_1. For example, an active layer 232 of the light-emitting layer 230_1 may be divided for each of the first, second, third, and fourth pixels PX1, PX2, PX3, and PX4_1, and first and second auxiliary layers 231 and 233 of the light-emitting layer 230_1 may be formed on the entire surface of a first substrate 100 as a common layer. Alternatively, all the elements of the light-emitting layer 230_1 may be formed on the entire surface of the first substrate 100 for all the first, second, third, and fourth pixels PX1, PX2, PX3, and PX4_1.

The display device 10_1 may include a light provider 200_1, a light converter 301_1, and a filler layer 400 disposed between the light provider 200_1 and the light converter 301_1. The light provider 200_1 includes the light-emitting layer 230_1 and may provide light toward the light converter 301_1. Incident light L3 provided by the light provider 200_1 may be light of a third wavelength band.

The light converter 301_1 may include a wavelength conversion layer 350_1, a light-transmitting layer 353, and a color filter layer 320. The wavelength conversion layer 350_1 may include a first wavelength conversion layer 351 which is disposed to overlap with the first pixel PX1 and a second wavelength conversion layer 352 which is disposed to overlap with the second pixel PX2. The wavelength conversion layer 350_1 may further include a third wavelength conversion layer 354_1 which is disposed to overlap with the first subpixel SPX1_1, as illustrated in FIG. 12. The third wavelength conversion layer 354_1 may receive the incident light L3 and may then emit light L4 of a fourth color which includes light L1 of a first wavelength band and light L2 of a second wavelength band. The light-transmitting layer 353 may be disposed to overlap with the third pixel PX3 and may emit the incident light L3 to the outside without changing the wavelength of the incident light L3.

The color filter layer 320 may include first, second, third, and fourth color filters 321, 322, 323, and 324. The first color filter 321 may be, but is not limited to, a red color filter that transmits red light therethrough and absorbs other light. The second color filter 322 may be, but is not limited to, a green color filter that transmits green light therethrough and absorbs other light. The third color filter 323 may be, but is not limited to, a blue color filter that transmits blue light therethrough and absorbs other light.

The fourth color filter 324, which is disposed to overlap with the second subpixel SPX2_1, may transmit the incident light L3 therethrough and may emit the incident light L3 to the outside. The fourth color filter 324 may be the same as the third color filter 323. That is, the fourth color filter 324 may be a blue color filter that transmits blue light therethrough and absorbs other light. Thus, light transmitted through the second subpixel SPX2_1 may be blue light.

The first and second subpixels SPX1_1 and SPX2_1 may receive the incident light L3 and may then emit light to the outside. The first subpixel SPX1_1 may include the third wavelength conversion layer 354_1 and may emit light by changing the wavelength of the incident light L3. The third wavelength conversion layer 354_1 may include first and second wavelength conversion materials (351a and 352a of FIG. 2) and may thus emit light by changing the incident light L3 into light of the first color and the second color.

The light conversion rate of the third wavelength conversion layer 354_1 may be higher than the light conversion rate of the third wavelength conversion layer 354 of FIGS. 1 through 3. The light conversion rate of the third wavelength conversion layer 354_1 may be defined as the ratio of wavelength-converted light by the first and second wavelength conversion materials to all beams of light incident upon the third wavelength conversion layer 354_1. The thicker the wavelength conversion layer 354_1 is or the more wavelength conversion material the wavelength conversion layer 354_1 contains, the higher the light conversion rate of the wavelength conversion layer 354_1 becomes. The third wavelength conversion layer 354_1 may transmit a smaller amount of light than the third wavelength conversion layer 354 of FIG. 4. That is, because the amount of transmitted light through the third wavelength conversion layer 354_1 is reduced, light emitted by the first subpixel SPX1_1 may not be white light. For example, yellow light, instead of white light, may be emitted from the first subpixel SPX1_1 because the blue light transmitted through the third wavelength conversion layer 354_1 is not enough to convert the light emitted from the first sub-pixel into the white light. Thus, the fourth pixel PX4_1 may realize white light by emitting light not only through the first subpixel SPX1_1 but also through the second subpixel SPX2_1. As the light conversion rate of the first subpixel SPX1_1 increases, the amount of light emitted by the second subpixel SPX2_1 may increase. In one embodiment, light emitted by the first subpixel SPX1_1 may be yellow light, and light emitted by the second subpixel SPX2_1 may be blue light. That is, light emitted by the fourth pixel PX4_1 may be white light which is the mixture of yellow light and blue light.

In the embodiment of FIGS. 10 through 12, reflected light may be controlled in the same manner as in the embodiment of FIGS. 7 through 9. That is, the first subpixel SPX1_1 may receive external light and may then reflect light of the first wavelength band and light of the second wavelength band. In this case, reflected light may be reflected through the first subpixel SPX1_1, and as a result, NB reflection may not be able to be realized. However, because the second subpixel SPX2_1 is configured to reflect blue light, NB reflection of the display device 10_1 can be realized. The ratio of reflected light from the first subpixel SPX1_1 to reflected light from the second subpixel SPX2_1 may be determined by the area ratio of the first subpixel SPX1_1 to the second subpixel SPX2_1.

Figure 28:
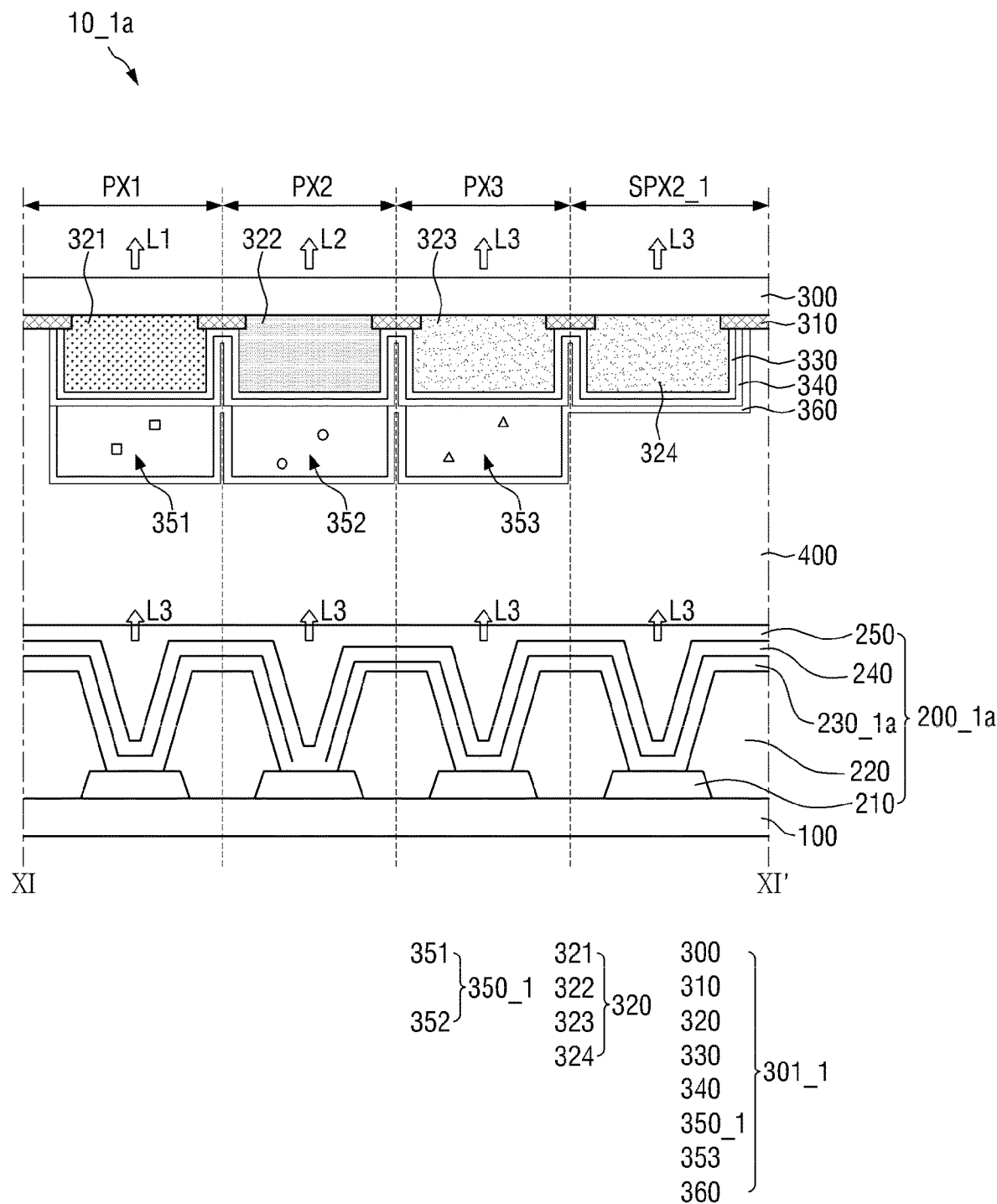
FIG. 28 is a cross-sectional view illustrating a modified example of FIG. 11.

Meanwhile, the arrangement of the light-emitting layer 230 may vary. FIG. 28 is a cross-sectional view illustrating a modified example of FIG. 11, and FIG. 29 is a cross-sectional view illustrating a modified example of FIG. 12.

Figure 29:
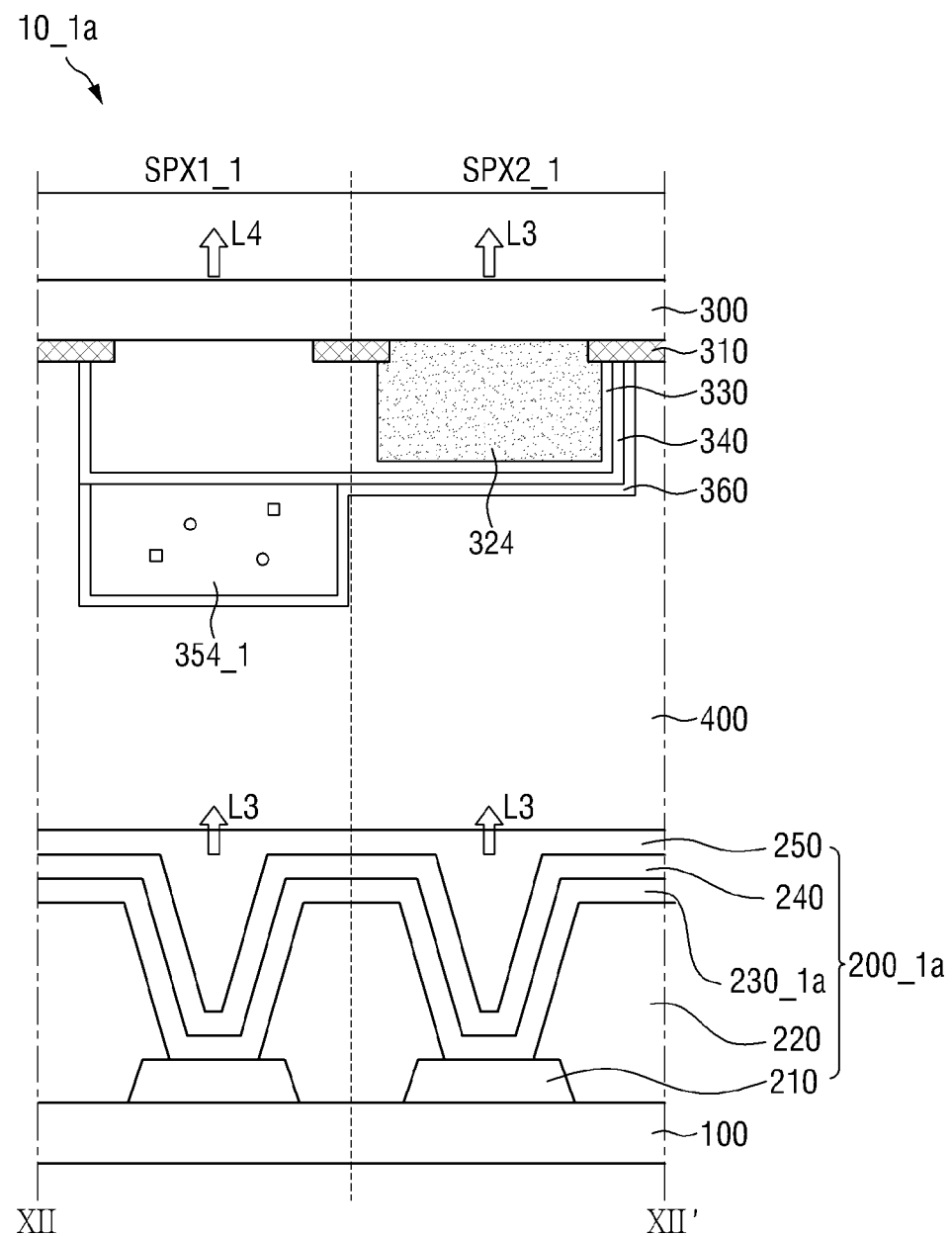
FIG. 29 is a cross-sectional view illustrating a modified example of FIG. 12.

Referring to FIGS. 28 and 29, a light-emitting layer 230_1a of a light provider 200_1a may be formed on the entire surface of a first substrate 100 of a display device 10_1a. Specifically, the light-emitting layer 230_1a may be disposed in common for first, second, and third pixels PX1, PX2, and PX3 and first and second subpixels SPX1_1 and SPX2_1 of a fourth pixel PX4 and may be further disposed on a pixel defining film 220. In the first, second, and third pixels PX1, PX2, and PX3 and the first subpixel SPX1-1 and second subpixel SPX2_1 of the fourth pixel PX4, the light-emitting layer 230_1a may be in contact with first electrodes 210 and a second electrode 240. The light-emitting layer 230_1a, like the light-emitting layer 230 of FIGS. 2 through 4, may include a first auxiliary layer, an active layer, and a second auxiliary layer.

The relationship between the reduction of transmitted light and light transmitted through the second subpixel SPX2_1 will hereinafter be described with reference to FIGS. 13 and 14, which show the light transmission spectrums of the first and second subpixels SPX1_1 and SPX2_1.

Figure 13:
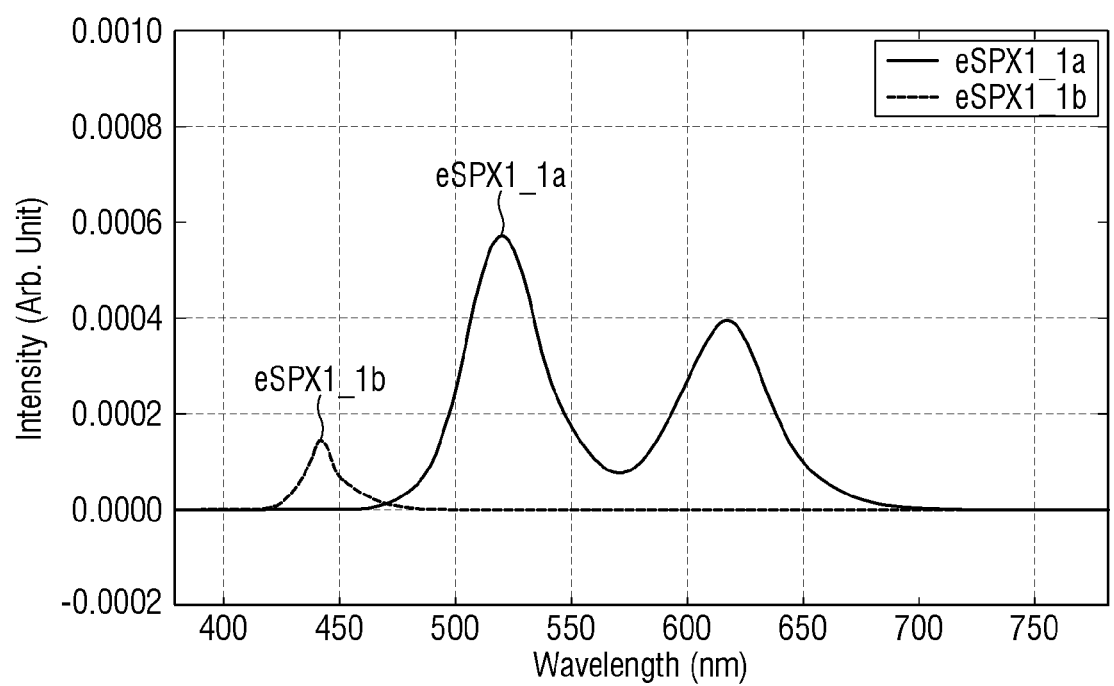
FIG. 13 shows the light transmission spectrum of a first subpixel according to another embodiment of the present disclosure.

Referring to FIG. 13, the light transmission spectrum of the first subpixel SPX1_1 may include a converted light transmission spectrum eSPX1_1a corresponding to light converted by the first and second wavelength conversion materials of the first subpixel SPX1_1 and a transmitted light transmission spectrum eSPX1_1b corresponding to light transmitted without reacting with the first and second wavelength conversion materials of the first subpixel SPX1_1.

The converted light transmission spectrum eSPX1_1a may include green light in the wavelength band of 500 nm to 570 nm and red light in the wavelength band of 600 nm to 670 nm. The transmitted light transmission spectrum eSPX1_1b may include blue light in the wavelength band of 420 nm to 480 nm. The light conversion rate of the first subpixel SPX1_1 may be higher than the light conversion rate of the first subpixel SPX1. That is, the intensity of converted light may be greater than the intensity of transmitted light. Mixed light with an insufficient amount of blue light may be recognized as being yellowish. For example, if the thickness of the first subpixel SPX1_1 is 6 μm or greater, the first subpixel SPX1_1 may realize white light together with the second subpixel SPX2_1.

Figure 14:
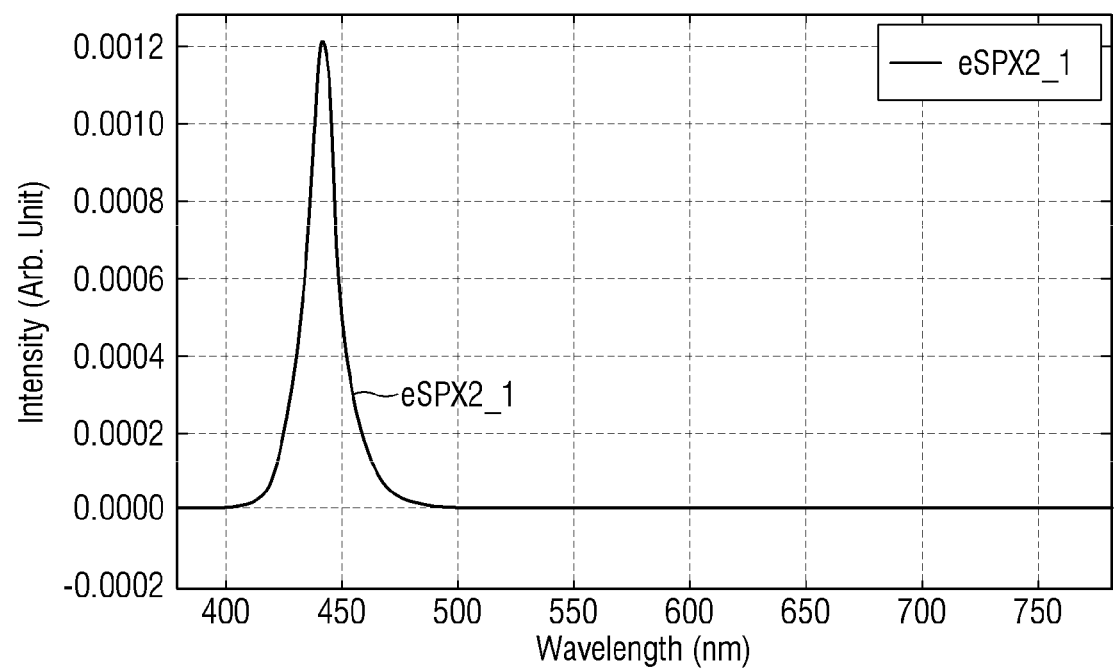
FIG. 14 shows the light transmission spectrum of a second subpixel according to another embodiment of the present disclosure.

Referring to FIG. 14, a light transmission spectrum eSPX2_1 of the second subpixel SPX2_1 may include a wavelength band of 420 nm to 480 nm. That is, the second subpixel SPX2_1 may emit blue light. The fourth pixel PX4_1 may realize white light through light from the first subpixel SPX1_1 and the second subpixel SPX2_1. The intensity of blue light may be determined by the area of the second subpixel SPX2_1. White light may be realized by controlling the area ratio of the first subpixel SPX1_1 to the second subpixel SPX2_1. For example, if light transmitted through the fourth pixel PX4_1 is close to yellow light, rather than to white light, the area of the second subpixel SPX2_1 may be increased such that the light transmitted through the fourth pixel PX4_1 may become white light. On the other hand, if light transmitted through the fourth pixel PX4_1 is close to blue light, the area of the first subpixel SPX1_1 may be increased such that the light transmitted through the fourth pixel PX4_1 may become white light. The area ratio of the first subpixel SPX1_1 to the second subpixel SPX2_1 that can allow white light to be emitted from the fourth pixel PX4_1 may vary depending on the content of the first and second wavelength conversion materials in the first subpixel SPX1_1, the thickness of the third wavelength conversion layer 354_1, and the stack structure of the second subpixel SPX2_1, but is not particularly limited as long as white light can be realized.

Figure 15:
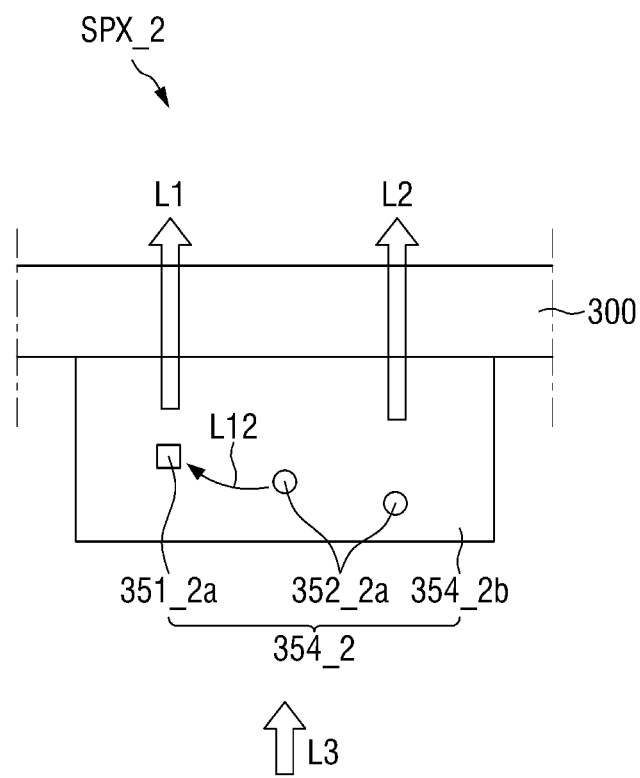
FIG. 15 is a cross-sectional view illustrating a third wavelength conversion layer according to an embodiment of the present disclosure.
Figure 16:
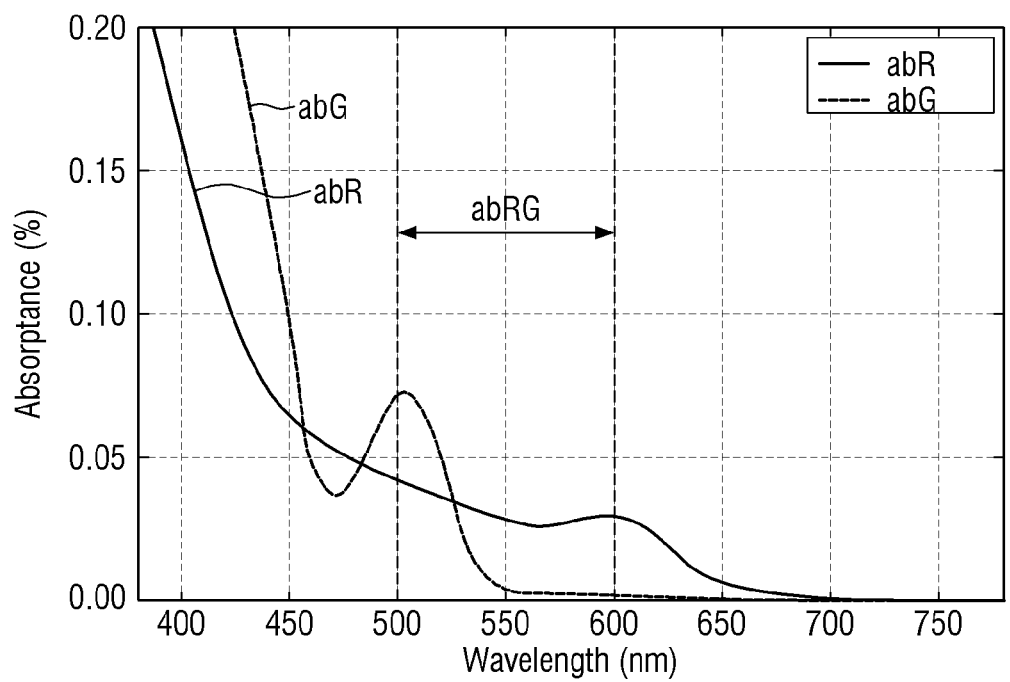
FIG. 16 is a graph showing the absorptances (by wavelength band) of wavelength conversion materials.

FIG. 15 is a cross-sectional view illustrating a first subpixel having a hybrid structure according to an embodiment of the present disclosure. FIG. 16 is a graph showing the absorptances (by wavelength band) of wavelength conversion materials. Specifically, FIG. 15 illustrates a second substrate 300 and a third wavelength conversion layer 354_2 disposed below the second substrate 300, and for convenience, other elements are not illustrated in FIG. 15. The third wavelength conversion layer 354_2 may include first and second wavelength conversion materials 351_2a and 352_2a. In the third wavelength conversion layer 354_2, the first and second wavelength conversion materials 351_2a and 352_2a may be mixed and dispersed in a light-transmitting resin 354_2b. An amount of the first and second wavelength conversion materials 351_2a and 352_2a may be controlled as necessary. The first wavelength conversion material 351_2a may receive incident light L3 and may convert the incident light L3 into light L1 having a first wavelength band, and the second wavelength conversion material 352_2a may receive the incident light L3 and may convert the incident light L3 into light L2 having a second wavelength band. However, when the first and second wavelength conversion materials 351_2a and 352_2a are mixed together, the light conversion efficiency of the second wavelength conversion material 352_2a may be lowered. Some light L12 emitted from the second wavelength conversion material 352_2a may be absorbed by the first wavelength conversion material 351_2a.

FIG. 16 shows an absorption wavelength band graph abR of the first wavelength conversion material 351_2a and an absorption wavelength band graph abG of the second wavelength conversion material 352_2a.

Referring to FIG. 16, the first wavelength conversion material 351_2a may absorb and convert some light of a wavelength band abRG of about 500 nm to 600 nm, which corresponds to the second wavelength band. That is, some light converted by the second wavelength conversion material 352_2a may be absorbed by the first wavelength conversion material 351_2a and converted into the light L1. As a result, when the first and second wavelength conversion materials 351_2a and 352_2a are mixed together, the light conversion efficiency of the second wavelength conversion material 352_2a may be lowered.

Referring again to FIG. 15, because the light conversion efficiency of the second wavelength conversion material 352_2a is lowered, the ratio of the second wavelength conversion material 352_2a dispersed in the third wavelength conversion layer 354_2 may be controlled to be greater than the ratio of the first wavelength conversion material 351_2a dispersed in the third wavelength conversion layer 354_2. That is, the content of the second wavelength conversion material 352_2a in the third wavelength conversion layer 354_2 may be greater than the content of the first wavelength conversion material 351_2a in the third wavelength conversion layer 354_2. Preferably, the content of the second wavelength conversion material 352_2a in the third wavelength conversion layer 354_2 may be twice greater than the content of the first wavelength conversion material 351_2a in the third wavelength conversion layer 354_2. The third wavelength conversion layer 354_2 may be formed by mixing the first and second wavelength conversion materials 351_2a and 352_2a through a photoresist (PR) process or an inkjet process, but the present disclosure is not limited thereto.

Figure 17:
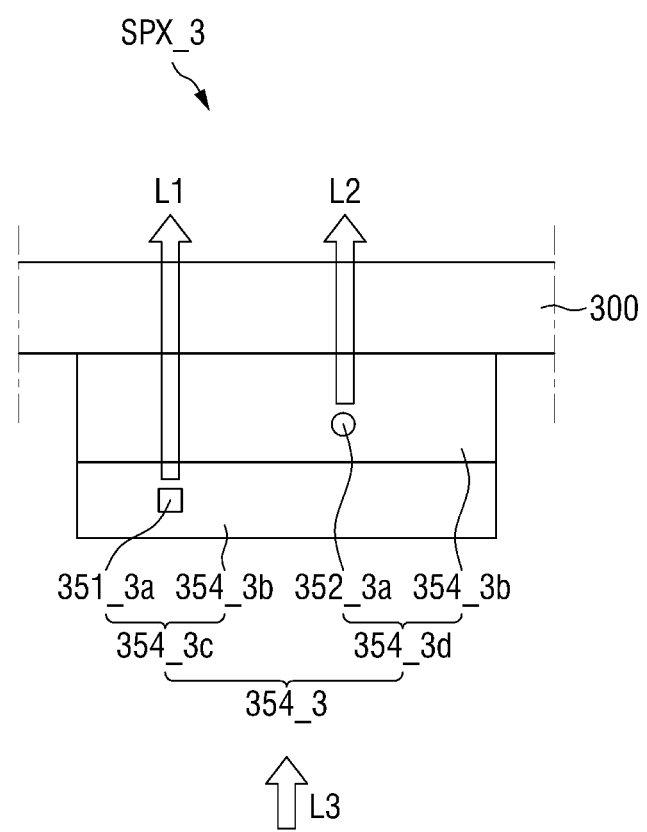
FIG. 17 is a cross-sectional view illustrating a third wavelength conversion layer according to another embodiment of the present disclosure.

FIG. 17 is a cross-sectional view illustrating a first subpixel according to another embodiment of the present disclosure. FIG. 17 illustrates a second substrate 300 and a third wavelength conversion layer 354_3 disposed below the second substrate 300. The third wavelength conversion layer 354_3, unlike the third wavelength conversion layer 354_2 of FIG. 15, may have a stack of material layers. Specifically, the third wavelength conversion layer 354_3 may include first and second wavelength conversion material layers 354_3c and 354_3d. The first wavelength conversion material layer 354_3c may be disposed closer than the second wavelength conversion material layer 354_3d to incident light L3. As already described above with reference to FIG. 16, light L2 of a second wavelength band, transmitted through a second wavelength conversion material 352a_3a, may be converted by a first wavelength conversion material 351a_3a into the light L1. If the second wavelength conversion material layer 354_3d is disposed close to the incident light L3, the second wavelength conversion material 352a_3a may absorb the incident light L3 ahead of the first wavelength conversion material 351-3a and may emit the light L2 of the second wavelength band. Then, the light L2 of the second wavelength band may be converted into light L1 of a first wavelength band by the first wavelength conversion material 351_3a. Thus, if the second wavelength conversion material layer 354_3d is disposed closer than the first wavelength conversion material layer 354_3c to the incident light L3, the light conversion efficiency of the second wavelength conversion material layer 354_3d may be lowered.

In a case where the third wavelength conversion layer 354_3 is deposited on the second substrate 300, the second wavelength conversion material layer 354_3d may be formed on the second substrate 300, and the first wavelength conversion material layer 354_3c may be formed on the second wavelength conversion material layer 354_3d close to the light provider. The first wavelength conversion material layer 354_3c and the first wavelength conversion layer 351 of FIG. 2 may be formed at the same time. Also, the second wavelength conversion material layer 354_3d and the second wavelength conversion layer 352 of FIG. 2 may be formed at the same time. Alternatively, in a case where a light provider is formed on the second substrate 300 and the third wavelength conversion layer 354_3 is formed on the light provider, the first wavelength conversion material layer 354_3c may be formed first, and the second wavelength conversion material layer 354_3d may be formed on the first wavelength conversion material layer 354_3c. The third wavelength conversion layer 354_3 may be formed by stacking the first and second wavelength conversion material layers 354_3c and 354_3d through a PR process or an inkjet process, preferably, an inkjet process.

The structures of second subpixels according to embodiments of the present disclosure will hereinafter be described with reference to FIGS. 18 through 21.

Figure 18:
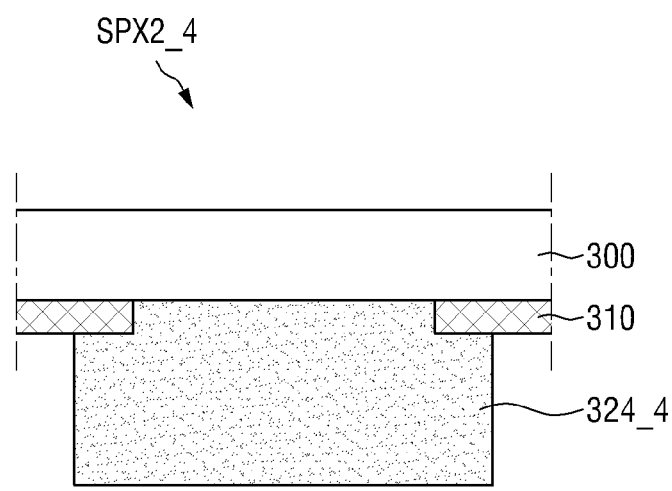
FIGS. 18, 19, 20 and 21 are cross-sectional views illustrating second subpixels according to embodiments of the present disclosure.

FIG. 18 illustrates a second subpixel SPX2_4 in which a fourth color filter 324_4 is disposed on a second substrate 300. Referring to FIG. 18, the second subpixel SPX2_4 may include the fourth color filter 324_4. As already mentioned above, in a case where the second subpixel SPX2_4 does not include a light-emitting layer, the second subpixel SPX2_4 may be a region for correcting the color coordinates of reflected light to realize NB reflection. External light incident upon the second subpixel SPX2_4 may be incident into a display device, passing through the fourth color filter 324_4. The external light incident into the display device may be reflected by electrodes, wires, organic layers, and/or the interfaces between the layers and may then be emitted out of the display device, passing through the fourth color filter 324_4 again. The light emitted out of the display device may be viewed by a user as reflected light. The reflected light passing through the fourth color filter 324_4 may be light of a third wavelength band. Reflected light from the second subpixel SPX2_4 may be blue light, and the blue light may be mixed with reflected light from a first subpixel to realize NB reflection.

In a case where the second subpixel SPX2_4 includes a light-emitting layer, the second subpixel SPX2_4 may be a region not only for correcting the color coordinates of reflected light to realize NB reflection but also for correcting the color coordinates of transmitted light to realize white light emission. When a sufficient amount of transmitted light cannot be obtained from the first subpixel and thus light of the third wavelength band is not be enough to realize white light, the white light may be realized with the help of the second subpixel SPX2_4. Light incident from a light provider may be emitted to the outside through the fourth color filter 324_4. In one embodiment, incident light L3 and light transmitted through the fourth color filter 324_4 may both be blue light. The light transmitted through the fourth color filter 324_4 may be light having a higher color purity than the incident light L3. That is, the light transmitted through the fourth color filter 324_4 may have a sharper wavelength spectrum than the incident light L3.

By using blue light having a high color purity, the color purity of white light, which is the mixture of light from the first subpixel and light from the second subpixel SPX2_4, can be improved.

Figure 19:
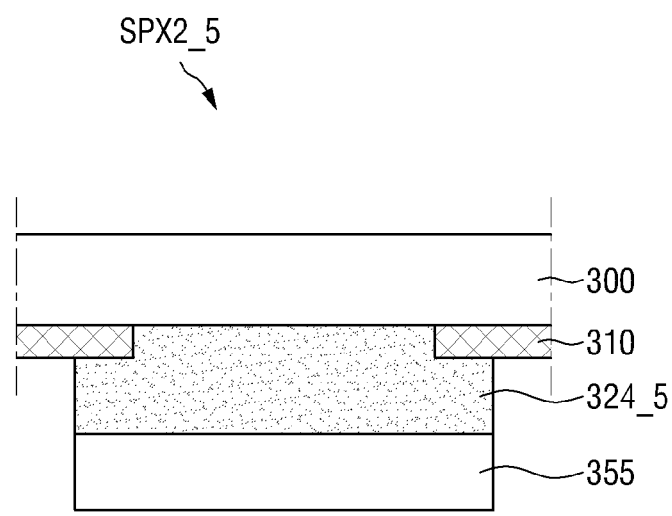
Figure 20:
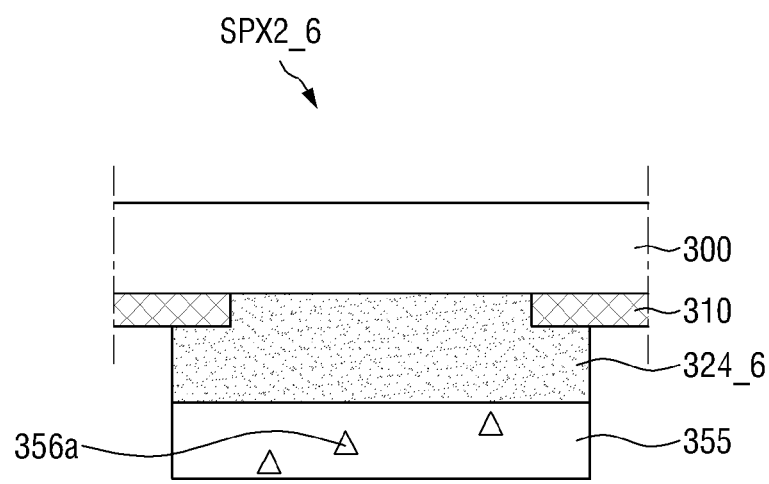

FIG. 19 illustrates a second subpixel SPX2_5 in which a fourth color filter 324_5 is disposed on a second substrate 300 and a light-transmitting resin 355 is disposed on the fourth color filter 324_5. FIG. 20 illustrates a second subpixel SPX2_6 in which a fourth color filter 324_6 is disposed on a second substrate 300 and a light-transmitting resin 355 including scatterers 356a is disposed on the fourth color filter 324_6.

Referring to FIG. 19, the second subpixel SPX2_5, unlike the second subpixel SPX2_4 of FIG. 18, may further include a light-transmitting resin 355. Although not specifically illustrated, the light-transmitting resin 355 may include a colorant. For example, the colorant may be a blue colorant such as a blue dye or a blue pigment and can sharpen the blue spectrum of reflected light.

Referring to FIG. 20, a second subpixel SPX2_6 may include a light-transmitting resin 355 and may further include scatterers 356a dispersed in the light-transmitting resin 355. The scatterers 356a, which are particles having a different refractive index from the light-transmitting resin 355, may form an optical interface with the light-transmitting resin 355 and may scatter transmitted light. For example, the scatterers 356a may be metal oxide particles or organic particles.

In a case where the light-transmitting resin 355 including the scatterers 356a is disposed on a fourth color filter 324_6, light can be scattered in various directions, regardless of the incidence angle of the light, without substantially changing the wavelength of light transmitted through the second subpixel SPX2_6. That is, NB reflection of reflected light, or white light, can be realized in a fourth pixel regardless of the direction.

Figure 21:
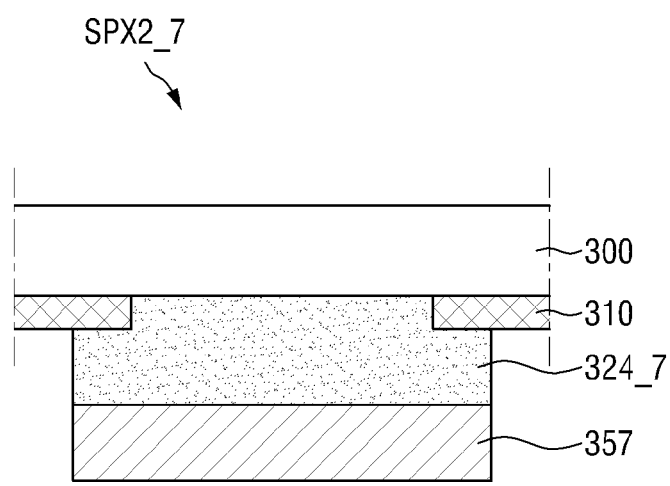

FIG. 21 illustrates a second subpixel SPX2_7 in which a fourth color filter 324_7 is disposed on a second substrate 300 and a light-reflecting layer 357 is disposed on the fourth color filter 324_7. Referring to FIG. 21, the light-reflecting layer 357 may reflect external light incident upon the second subpixel SPX2_7. The light-reflecting layer 357 may reflect all types of light, rather than light of a particular wavelength band. In response to external light being incident upon the second subpixel SPX2_7, the fourth color filter 324_7 may block the transmission of light of all wavelength bands except for a third wavelength band therethrough. That is, only light of the third wavelength band may be transmitted through the fourth color filter 324_7. The transmitted light may be reflected at the interface between the fourth color filter 324_7 and the light-reflecting layer 357 to be emitted to the outside. The reflected light may be blue light and may be used to realize NB reflection. The light-reflecting layer 357 may include an organic material or a metal.

Figure 22:
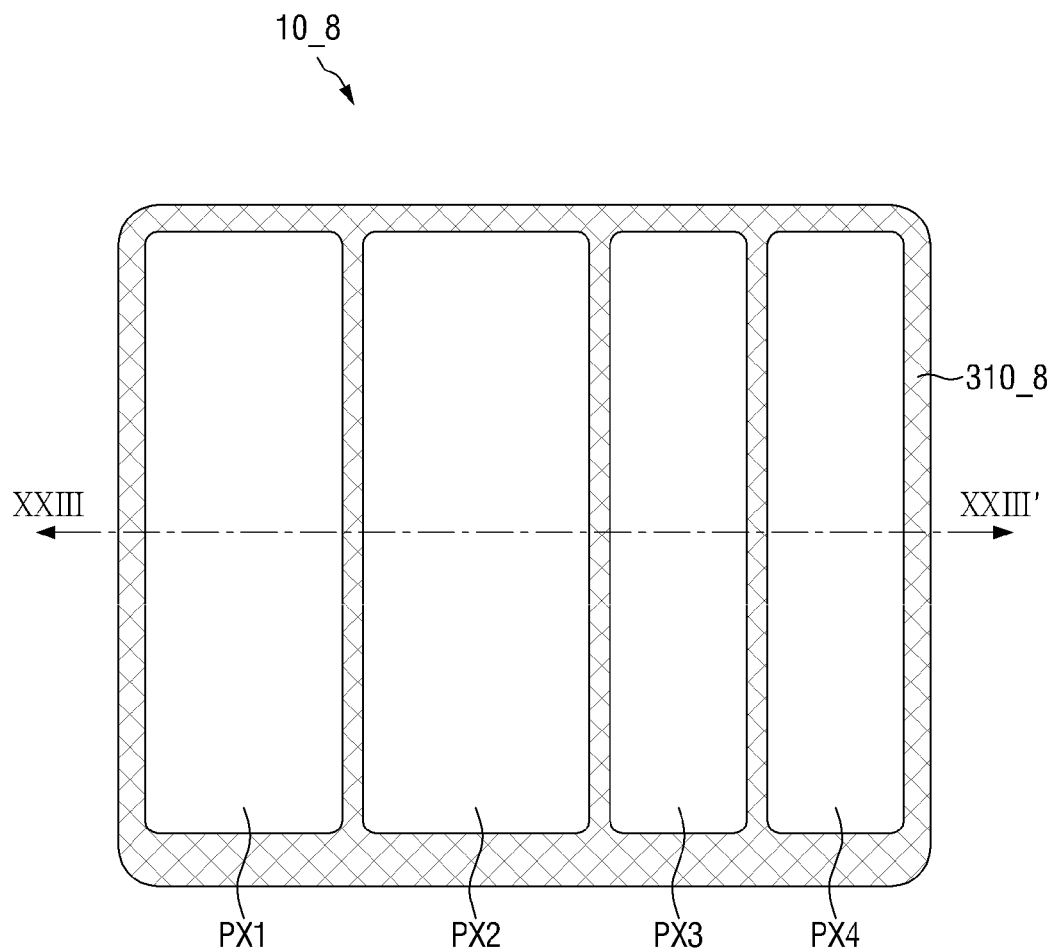
FIG. 22 is a plan view of a display device according to another embodiment of the present disclosure.
Figure 23:
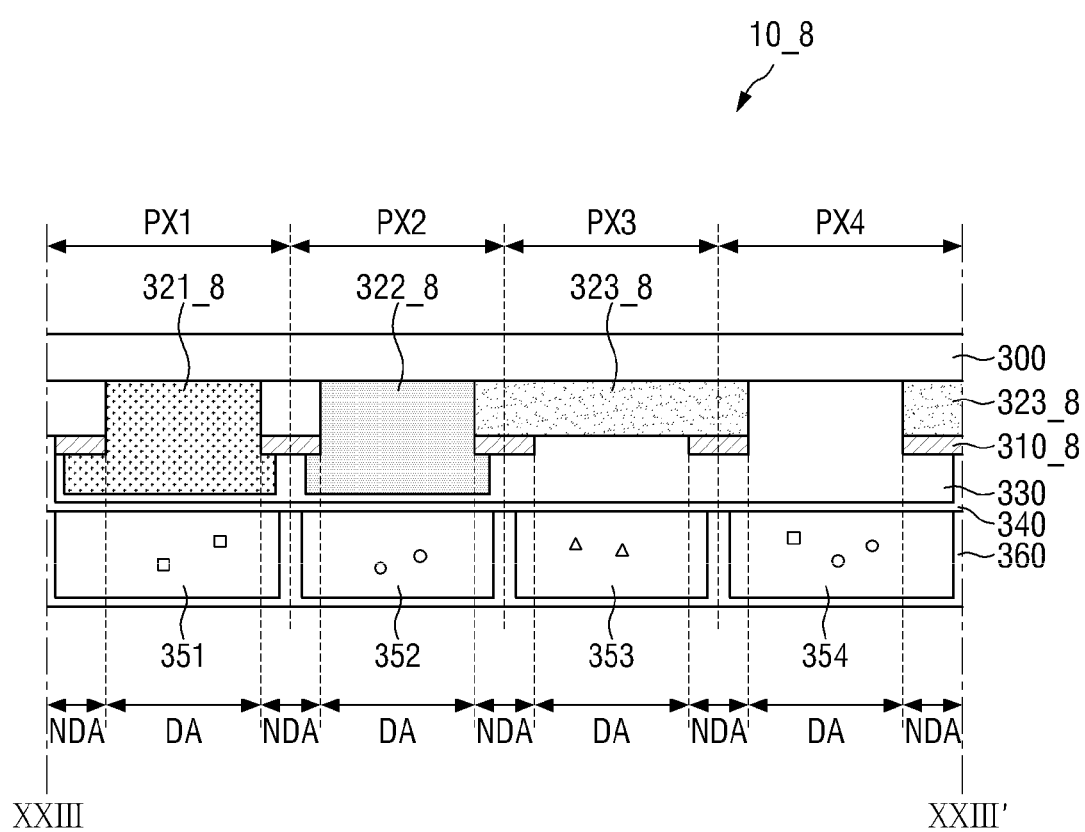
FIG. 23 is a cross-sectional view of the display device of FIG. 22.
Figure 24:
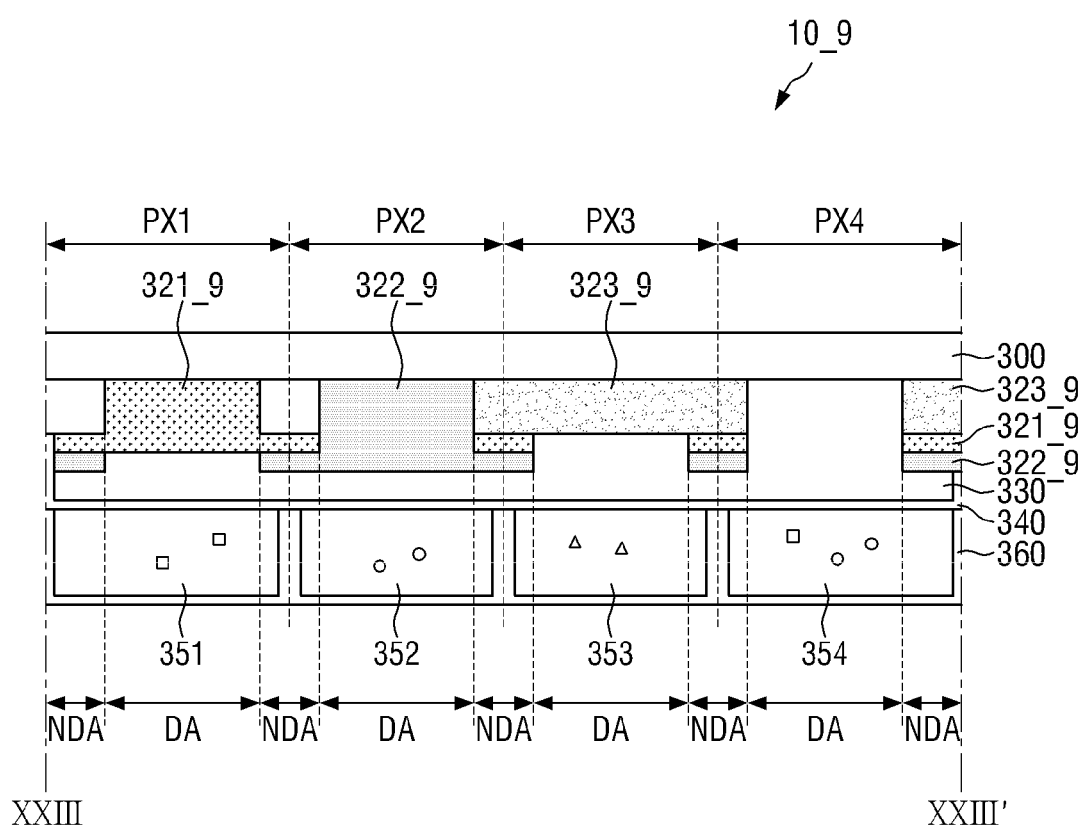
FIG. 24 is a cross-sectional view of a display device according to another embodiment of the present disclosure.

FIG. 22 is a plan view of a display device according to another embodiment of the present disclosure. FIG. 23 is a cross-sectional view of the display device of FIG. 22. FIG. 24 is a cross-sectional view of a display device according to another embodiment of the present disclosure. Specifically, FIG. 23 is a cross-sectional view, taken along line XXIII-XXIII' of FIG. 22, of a display device according to another embodiment of the present disclosure, and FIG. 24 is a cross-sectional view, taken along line XXIII-XXIII' of FIG. 22, of a display device according to another embodiment of the present disclosure.

The embodiments of FIGS. 22 through 24 differ from the embodiment of FIG. 1 in that a second subpixel for correcting the color coordinates of reflected light is not provided and a matrix pattern overlapping with a third color filter is provided for correcting the color coordinates of reflected light instead. The embodiments of FIGS. 22 through 24 will hereinafter be described, focusing mainly on the differences with the embodiment of FIG. 1.

Referring to FIG. 22, a display device 10_8, unlike the display device 10 of FIG. 1, does not include a second subpixel. A black matrix 310_8 may be disposed in an entire area except for light-emitting parts. That is, the black matrix 310_8 may be a matrix pattern disposed at the boundaries of each of a first pixel PX1, a second pixel PX2, a third pixel PX3, and a first subpixel SPX1. The display device 10_8 may include the black matrix 310_8, which selectively reflects light of a particular wavelength band to realize NB reflection. For example, in a case where the black matrix 310_8 reflects light having a wavelength of 380 nm to 500 nm, NB reflection can be realized using blue light reflected by the black matrix 310_8, without the need to form a second subpixel to reflect blue light. The material of the black matrix 310_8 is not particularly limited as long as it can reflect blue light while absorbing light of other colors.

The elements of the display device 10_8 will hereinafter be described with reference to FIG. 23.

Referring to FIG. 23, the display device 10_8 may include a substrate 300, a third color filter 323_8 disposed on the substrate 300, the black matrix 310_8 disposed on the third color filter 323_8, and first and second color filters 321_8 and 322_8 disposed on the black matrix 310_8.

Areas that overlap with the black matrix 310_8 in a direction perpendicular to the substrate 300 may be non-display areas NDA that block the transmission of light therethrough. The non-display areas NDA may be disposed at the boundaries of each of the first pixel PX1, the second pixel PX2, the third pixel PX3, and the fourth pixel PX4 to define the first pixel PX1, the second pixel PX2, the third pixel PX3, and the fourth pixel PX4. That is, the matrix pattern may be disposed in the non-display areas NDA. Other areas than the non-display areas NDA that overlap with the first pixel PX1, the second pixel PX2, the third pixel PX3, and the fourth pixel PX4 may be display areas DA that transmit light therethrough.

The third color filter 323_8 may be disposed in the entire third pixel PX3 and may transmit blue light therethrough while absorbing light of other colors. The third color filter 323_8 may be disposed at the boundaries of each of the first pixel PX1, the second pixel PX2, the third pixel PX3, and the fourth pixel PX4.

The black matrix 310_8 may be disposed on the third color filter 323_8. As already mentioned above, the black matrix 310_8 may be disposed at the boundaries of each of the first pixel PX1, the second pixel PX2, the third pixel PX3, and the fourth pixel PX4 to define the first pixel PX1, the second pixel PX2, the third pixel PX3, and the fourth pixel PX4.

The matrix pattern may be an area in which the black matrix 310_8 and the third color filter 323_8 overlap with each other. The matrix pattern may correct the color coordinates of reflected light converted by a fourth pixel PX4 and may realize NB reflection of the display device 10_8.

Specifically, external light incident upon the non-display areas NDA of the display device 10_8 may pass through the third color filter 323_8 which is disposed between the substrate 300 and the black matrix 310_8. That is, the external light passing through the third color filter 323_8 may be blue light and may be reflected at the interface between the black matrix 310_8 and the third color filter 323_8 to be emitted to the outside.

In one embodiment, the black matrix 310_8 may include an organic material having a different reflective index from the third color filter 323_8. In a case where the black matrix 310_8 and the third color filter 323_8 have different refractive indexes, some light may be reflected at the interface between the black matrix 310_8 and the third color filter 323_8 depending on the difference between the refractive indexes of the black matrix 310_8 and the third color filter 323_8.

In another embodiment, the black matrix 310_8 may be formed of a metal. In a case where the black matrix 310_8 includes a metal, external light may be reflected at the interface between the black matrix 310_8 and the third color filter 323_8.

The material of the black matrix 310_8 is not particularly limited as long as it can reflect external light passing through the third color filter 323_8.

A first color filter 321_8 may be disposed to completely cover a light emitting region of the first pixel PX1. The first color filter 321_8 may at least partially overlap with the third color filter 323_8 and the black matrix 310_8, which are disposed at boundaries of the first pixel PX1, in the direction perpendicular to the substrate 300. The first color filter 321_8 may be disposed to overlap with a first wavelength conversion layer 351. The first color filter 321_8 may transmit light of a first color, among beams of light transmitted through the first wavelength conversion layer 351, therethrough and may absorb light of other colors, thereby improving the color purity of light of the first color to be emitted to the outside. The first color may be red color, but the present disclosure is not limited thereto.

A second color filter 322_8 may be disposed to completely cover a light emitting region of the second pixel PX2. The second color filter 322_8 may at least partially overlap with the third color filter 323_8 and the black matrix 310_8, which are disposed at boundaries of the second pixel PX2, in the direction perpendicular to the substrate 300. The second color filter 322_8 may be disposed to overlap with a second wavelength conversion layer 352. The second color filter 322_8 may transmit light of a second color, among beams of light transmitted through the second wavelength conversion layer 352, therethrough and may absorb light of other colors, thereby improving the color purity of light of the second color to be emitted to the outside. Light of the second color may be green light, but the present disclosure is not limited thereto.

The embodiment of FIG. 24 differs from the embodiment of FIG. 23 in that a black matrix is not provided and first and second color filters are provided to overlap with a third color filter. The embodiment of FIG. 24 will hereinafter be described, focusing mainly on the differences with the embodiment of FIG. 23.

Referring to FIG. 24, a display device 10_9 may include a substrate 300, a third color filter 323_9 disposed on the substrate 300, a first color filter 321_9 disposed on the third color filter 323_9, and a second color filter 322_9 disposed on the first color filter 321_9. The third color filter 323_9 may be disposed to completely cover a display area DA of the third pixel PX3 and non-display areas NDA disposed between adjacent display areas, for example, between the first display area and the second display area, between the second display area and the third display area, between the third display area and the fourth display area, and between the fourth display area and the first display area, and may transmit blue light therethrough while absorbing light of other colors. The third color filter 323_9 may be disposed at non-display areas between each of a first pixel PX1, a second pixel PX2, a third pixel PX3, and a fourth pixel PX4. The first color filter 321_9 may be disposed to completely cover a display area DA of the first pixel PX1 and non-display areas disposed between adjacent display areas. The first color filter 321_9 may be disposed on each of the third color filter 323_9.

The first color filter 321_9 may include an organic material having a different refractive index from the third color filter 323_9. In a case where the first and third color filters 321_9 and 323_9 have different refractive indexes, some light may be reflected at the interface between the first and third color filters 321_9 and 323_9.

The second color filter 322_9 may be disposed to completely cover a display area of the second pixel PX2 and non-display areas disposed between adjacent display areas. The second color filter 322_9 may be disposed on each of the first color filter 321_9.

Accordingly, the first, second, and third color filters 321_9, 322_9, and 323_9 may overlap with one another in a direction perpendicular to the substrate 300 at the boundaries of each of the first, second, third, and fourth pixels PX1, PX2, PX3, and PX4. Areas in which the first, second, and third color filters 321_9, 322_9, and 323_9 may overlap with one another may be non-display areas NDA that prevent light from transmitting therethrough. Because only blue light can transmit through the third color filter 323_9, the reflected light from the non-display areas NDA may be the blue light.

Specifically, in response to external light being incident upon the non-display areas NDA, the incident light may pass through the third color filter 323_9. The third color filter 323_9 may absorb light other than blue light. Some of the light transmitted through the third color filter 323_9 may be reflected at the interface between the third color filter 323_9 and the first color filter 321_9 to be emitted to the outside. Light incident further into the display device 10_9 without being reflected at the interface between the third color filter 323_9 and the first color filter 321_9 may be absorbed by the first and second color filters 321_9 and 322_9.

That is, only blue incident light may be selectively reflected, and other incident light may be absorbed by the first and second color filters 321_9 and 322_9.

The reflected blue light can correct the color coordinates of the reflected light changed by the fourth pixel PX4 in the same manner as in the above embodiment. That is, the neutral black reflection of the display device 10_9 can be realized.

However, the effects of the embodiments are not restricted to the one set forth herein. The above and other effects of the embodiments will become more apparent to one of daily skill in the art to which the embodiments pertain by referencing the claims.

In concluding the detailed description, those skilled in the art will appreciate that many variations and modifications can be made to the preferred embodiments without substantially departing from the principles of the present inventive concept. Therefore, the disclosed preferred embodiments of the inventive concept are used in a generic and descriptive sense only and not for purposes of limitation.

What is claimed is:

1. A display device comprising:
   a substrate including a plurality of pixel regions on which a plurality of pixels are disposed;
   a light-emitting layer disposed on the substrate and providing first light having a first wavelength; and
   a light converter disposed on the light-emitting layer and receiving the first light,
   wherein
   the plurality of pixels include first, second, third, and fourth pixels,
   the fourth pixel includes first and second subpixels,
   the light converter includes a first wavelength conversion layer which is disposed in the first pixel, a second wavelength conversion layer which is disposed in the second pixel, a light-transmitting layer which is disposed in the third pixel, a third wavelength conversion layer which is disposed in the first subpixel, and a color filter layer which is disposed in the third pixel and the second subpixel, and includes a color filter transmitting the first light therethrough,
   the first wavelength conversion layer includes a first wavelength conversion material which converts the first light into second light having a second wavelength that is longer than the first wavelength,
   the second wavelength conversion layer includes a second wavelength conversion material which converts the first light into third light having a third wavelength that is longer than the first wavelength, and
   the third wavelength conversion layer includes the first and second wavelength conversion materials.

2. The display device of claim 1, wherein
   the color filter layer further includes a first color filter which transmits the second light therethrough and a second color filter which transmits the third light therethrough,
   the first color filter is disposed in the first pixel, and
   the second color filter is disposed in the second pixel.

3. The display device of claim 2, wherein the color filter disposed in the third pixel and the second subpixel are connected to each other to form single color filter.

4. The display device of claim 3, wherein
   the light converter further includes a black matrix which is disposed at boundaries between the plurality of pixels except a boundary between the third pixel and the second subpixel.

5. The display device of claim 2, further comprising:
   a light-transmitting resin disposed in the first subpixel, on the color filter.

6. The display device of claim 5, wherein the light-transmitting resin includes scatterers.

7. The display device of claim 6, wherein the light-transmitting resin includes a blue colorant.

8. The display device of claim 5, further comprising:
   a light-reflecting layer disposed in the second subpixel, on the color filter,
   wherein the light-reflecting layer includes an organic material or a metal.

9. The display device of claim 2, wherein the fourth pixel is configured to realize neutral black reflection for external light.

10. The display device of claim 2, wherein the plurality of pixels are configured to realize neutral black reflection for external light.

11. The display device of claim 1, wherein
    the first light is blue light,
    the second light is red light,
    the third light is green light, and
    light transmitted through the first subpixel includes a blue-light component, a red-light component, and a green-light component.

12. The display device of claim 11, wherein the light-emitting layer is disposed in the first pixel, the second pixel, the third pixel, and the first subpixel.

13. The display device of claim 12, wherein the light-emitting layer is not disposed in the second subpixel.

14. The display device of claim 13, wherein
    an intensity of the blue-light component of the light transmitted through the first subpixel is less than intensities of the red-light component and the green-light component of the light transmitted through the first subpixel.

15. The display device of claim 12, wherein the light-emitting layer is further disposed in the second subpixel.

16. The display device of claim 15, wherein
    light transmitted through the second subpixel is blue light, and
    an intensity of the blue-light component of the light transmitted through the second subpixel is greater than an intensity of the blue-light component of the light transmitted through the first subpixel.

17. The display device of claim 16, wherein portions of the light-emitting layer disposed in the first and second subpixels are connected to each other.

18. The display device of claim 1, wherein a content of the second wavelength conversion material in the third wavelength conversion layer is greater than a content of the first wavelength conversion material in the third wavelength conversion layer.

19. The display device of claim 1, wherein
the third wavelength conversion layer includes a first wavelength conversion material layer which includes the first wavelength conversion material and a second wavelength conversion material layer which is disposed on the first wavelength conversion material layer and includes the second wavelength conversion material, and
the first wavelength conversion material layer is disposed closer to the light-emitting layer than the second wavelength conversion material layer.

20. A display device comprising:
a first pixel;
a second pixel;
a third pixel; and
a fourth pixel,
wherein
the first, second, third, and fourth pixels are sequentially arranged adjacent to one another in a first direction,
the fourth pixel includes first and second subpixels arranged in a second direction which is perpendicular to the first direction,
one of the first and second pixels is a red pixel including a red color filter and the other pixel is a green pixel including a green color filter,
the third pixel is a blue pixel including a blue color filter,
each of the first pixel, the second pixel, the third pixel, and the first subpixel includes a light-emitting layer emitting blue light,
one of the first and second pixels includes a first wavelength conversion layer which includes a first wavelength conversion material that converts the blue light into red light and the other pixel includes a second wavelength conversion layer which includes a second wavelength conversion material that converts the blue light into green light,
the first subpixel includes a third wavelength conversion layer, which includes the first and second wavelength conversion materials, and
the second subpixel includes the blue color filter.

21. The display device of claim 20, wherein the first subpixel emits the red light, the green light and the blue light.

22. The display device of claim 21, wherein the blue color filter of the second subpixel does not overlap with the light-emitting layer.

23. The display device of claim 20, wherein the second subpixel includes the light-emitting layer.

24. The display device of claim 23, wherein mixed light of light emitted from the first subpixel and light emitted from the second subpixel is white light.

25. A display device comprising:
a substrate including a plurality of pixel regions on which a plurality of pixels are disposed;
a light-emitting layer disposed on the substrate and providing first light having a first wavelength; and
a light converter disposed on the light-emitting layer and receiving the first light,
wherein
the plurality of pixels include first, second, third, and fourth pixels,
the light converter includes a first wavelength conversion layer which is disposed in the first pixel, a second wavelength conversion layer which is disposed in the second pixel, a light-transmitting layer which is disposed in the third pixel, and a third wavelength conversion layer which is disposed in the fourth pixel,
the first wavelength conversion layer includes a first wavelength conversion material which converts the first light into second light having a second wavelength that is longer than the first wavelength,
the second wavelength conversion layer includes a second wavelength conversion material which converts the first light into third light having a third wavelength that is longer than the first wavelength,
the third wavelength conversion layer includes the first and second wavelength conversion materials,
the display device further comprises a matrix pattern disposed on the substrate along boundaries of each of the plurality of pixels, and
the matrix pattern reflects the first light.

26. The display device of claim 25, wherein
the light converter includes a color filter layer,
the color filter layer includes a first color filter, which transmits the second light therethrough, a second color filter, which transmits the third light therethrough, and a third color filter, which transmits the first light therethrough, the first color filter is disposed in the first pixel,
the second color filter is disposed in the second pixel, and
the third color filter is disposed in the third pixel and along the boundaries of each of the
plurality of pixels to overlap with the matrix pattern.

27. The display device of claim 26, wherein
the matrix pattern includes a black matrix,
the black matrix is disposed on the substrate along the boundaries of each of the plurality of pixels, and
the third color filter is disposed between the substrate and the black matrix.

28. The display device of claim 26, wherein
the first and second color filters are further disposed along the boundaries of each of the plurality of pixels, and
the first, second, and third color filters at least partially overlap with one another at the boundaries of each of the plurality of pixels in a direction perpendicular to the substrate.

* * * * *